United States Patent
Collier et al.

(10) Patent No.: US 7,211,795 B2
(45) Date of Patent: May 1, 2007

(54) METHOD FOR MANUFACTURING SINGLE WALL CARBON NANOTUBE TIPS

(75) Inventors: Charles Patrick Collier, San Marino, CA (US); Ma Ziyang, Pasandena, CA (US); Stephen R. Quake, San Marino, CA (US); Ian R. Shapiro, Pasadena, CA (US); Lawrence Wade, LaCanada, CA (US)

(73) Assignee: California Institute of Technology, Pasadena, CA (US)

( * ) Notice: Subject to any disclaimer, the term of this patent is extended or adjusted under 35 U.S.C. 154(b) by 212 days.

(21) Appl. No.: 11/045,240

(22) Filed: Jan. 27, 2005

(65) Prior Publication Data

US 2005/0269509 A1 Dec. 8, 2005

Related U.S. Application Data

(60) Provisional application No. 60/542,757, filed on Feb. 6, 2004.

(51) Int. Cl.
*G21K 7/00* (2006.01)
*G01B 5/28* (2006.01)

(52) U.S. Cl. ............... 250/307; 250/309; 73/866.5
(58) Field of Classification Search ............. 250/307
See application file for complete search history.

(56) References Cited

U.S. PATENT DOCUMENTS 6,002,471 A 12/1999 Quake
6,743,408 B2 * 6/2004 Lieber et al. ............ 423/447.1
2002/0178846 A1 * 12/2002 Dai et al. ................. 73/866.5

* cited by examiner

*Primary Examiner*—Nikita Wells
*Assistant Examiner*—James Leybourne
(74) *Attorney, Agent, or Firm*—Townsend and Townsend and Crew LLP

(57) ABSTRACT

A method for fabricating assembled structures. The method includes providing a tip structure, which has a first end, a second end, and a length defined between the first end and the second end. The second end is a free end. The method includes attaching a nano-sized structure along a portion of the length of the tip structure to extend a total length of the tip structure to include the length of the tip structure and a first length associated with the nano-sized structure. The method includes shortening the nano-sized structure from the first length to a second length. The method also includes pushing the nano-sized structure in a direction parallel to the second length to reduce the second length to a third length of the nano-sized structure along the direction parallel to the second length to cause the nano-sized structure to move along a portion of the length of the tip structure.

31 Claims, 15 Drawing Sheets

METHOD FOR MANUFACTURING SINGLE WALL CARBON NANOTUBE TIPS

CROSS-REFERENCES TO RELATED APPLICATIONS

This application claims priority to U.S. Provisional Application No. 60/542,757 filed on Feb. 6, 2004, Caltech Ref. No.: CIT-4039, which is hereby incorporated by reference herein in its entirety for all purposes.

STATEMENT AS TO RIGHTS TO INVENTIONS MADE UNDER FEDERALLY SPONSORED RESEARCH OR DEVELOPMENT

N/A

BACKGROUND OF THE INVENTION

The present invention relates generally to manufacture of materials such as nano-sized structures. More particularly, the present invention provides a method and structure for fabricating a nanotube based structure comprising an electrical shortening technique and mechanical forming technique to manufacture carbon based nanotube structures having a desired length. Merely by way of example, the invention has been applied to an atomic force microscope, but it would be recognized that the invention has a much broader range of applicability. For example, the invention can be applied to fluorescent atomic force microscope, commonly called FANSOM, other instrumentation, electronic devices, biological devices, and others.

Over the years, significant development of different types of microscopy has occurred. As merely an example, visible light optical microscopy using far field optics including lenses and light evolved from a simple compound microscope that is capable of resolving sizes of about 200 nanometers and greater. Examples of samples that are capable of being viewed using far field optics include biological cells and tissues, and others, which are often, bulk in nature. The resolving ability of such far field optical microscopy is generally limited by the diffraction of light. The diffraction limit for optical resolution has been stretched somewhat for far field imaging of very specific samples to perhaps 150 nanometers using confocal microscopes and other, related, approaches. Accordingly, atomic force microscopes ("AFM") and scanning optical microscopes including near field scanning optical microscopes were developed. The AFM and near field scanning optical microscopy ("ANSOM") have been developed to overcome certain limitations of far field optics. The AFM and near field scanning microscopes have also found many applications in biology, chemistry, physics, and materials science.

Near field scanning optical microscopy allows one to take optical images with resolutions below the diffraction limit of light. More particularly, light propagating through a waveguide is forced through a subwavelength aperture, which is then scanned in close proximity to a sample. Such subwavelength aperture techniques create other limitations. Here, physical limitations relate to a skin depth of the metal used to coat the waveguide and various scanning artifacts, which yield resolutions of 30 to 50 nanometers, most typically 50 to 100 nanometers. Apertureless near field scanning microscopes have been proposed and demonstrated to overcome these limitations, among others. Conventional ANSOM often involves using an oscillating sharp probe, which is scanned over the sample. The probe perturbs an incident laser beam, by introducing phase shifts in an electric field or by a periodic occlusion of the sample. Detection techniques are generally used to discriminate light scattered by near field interactions from a far field contribution. Limitations also exist with such ANSOM techniques. Such limitations include contaminated images based upon certain artifacts of the sample topography, and may include others.

A pioneering approach for achieving high resolution spectroscopic information using a scanning microscope is described in U.S. Pat. No. 6,002,471, assigned to California Institute of Technology, Pasadena, Calif., and in the name of Stephen R. Quake ("Quake"). Quake generally provides a system and method for obtaining high resolution spectroscopic information. The system generally includes a support and first optical elements for directing an optical beam at a sample, which is on the support. An optical element for collecting light emitted from the sample to reduce a background noise is also included. Other elements include a spectral dissociating apparatus, a probe, and a probe detection apparatus coupled to the probe. Although significant advances have occurred, certain limitations still exist with these conventional approaches.

Certain advances in technology have occurred with the probe design for conventional ANSOM and FANSOM designs. Such advances have relied upon single wall carbon nanotubes ("SWNTs"). Most particularly, single-wall carbon nanotubes have shown potential as high-resolution scanning microscopy probes. This includes, though is not limited to, application as high-resolution AFM imaging probes. A level of resolution possible for both single molecule imaging and force transduction in AFM is generally limited by size of the structure of the tip. Conventional silicon-based probe tips have radii of curvature of 5–15 nanometers Unfortunately, conventional silicon-based tips are often delicate, leading to substantial variations in tip shape and size even between successive images. SWNTs, on the other hand, have diameters between 1.5 and 6 nm, providing resolution comparable to molecular scale dimensions. Carbon nanotubes are also chemically and mechanically robust, with axial Young's moduli of about 1.25 TPa, resulting in a tip structure that is stable over prolonged imaging periods. SWNTs can be chemically functionalized uniquely at their very ends, permitting a broad array of applications in nanotechnology and biotechnology. Nevertheless, conventional carbon based nanotubes have limitations. That is, carbon based nanotubes are often difficult to reproducibly assemble in large quantities of high-quality single-wall nanotube AFM tips. These and other limitations are described throughout the present specification and more particularly below.

From the above, it is seen that improved high resolution scanning techniques are desired.

BRIEF SUMMARY OF THE INVENTION

The present invention relates generally to manufacture of materials such as nano-sized structures. More particularly, the present invention provides a method and structure for fabricating a nanotube based structure comprising an electrical shortening technique and mechanical forming technique to manufacture carbon based nanotube structures having a desired length. Merely by way of example, the invention has been applied to an atomic force microscope, but it would be recognized that the invention has a much broader range of applicability. For example, the invention can be applied to fluorescent atomic force microscope, commonly called FANSOM, other instrumentation, electronic devices, biological devices, and others. Additionally, the device(s) and applications can be from a variety of different fields such as electronics, semiconductor, inorganic chemistry, organic chemistry, life sciences, petroleum, biotechnology, financial, and others.

In a specific embodiment, the present invention provides a method for fabricating carbon based nanotubes for atomic force microscope ("AFM") applications. The method includes providing an AFM tip structure, which includes a first end, a second end, and a length defined between the first end and the second end. Preferably, the second end is a free end that protrudes into free space and is free from mechanical attachment. The method also includes attaching a carbon based nanotube structure along a portion of the length of the AFM tip structure to extend a total length of the AFM structure to include the length of the AFM tip structure and a first length associated with the carbon based nanotube structure. The method includes applying an electrical bias between the AFM tip structure and a substrate (e.g., electrically grounded or other reference potential) to cause a reducing of the carbon based nanotube structure from the first length to a second length. In a preferred embodiment, the substrate can be conductive doped-silicon or oxidized doped-silicon or gold plated or otherwise made somewhat electrically conductive. The method also forces the carbon based nanotube structure in a direction parallel to the second length to reduce the second length to a third length of the carbon based nanotube structure using a pushing action along the direction parallel to the second length to cause the carbon based nanotube structure to move along a portion of the length of the AFM tip structure.

In an alternative specific embodiment, the invention provides a method for fabricating carbon based nanotubes for atomic force microscope ("AFM") applications. The method includes providing an AFM tip structure, which has a first end, a second end, and a length defined between the first end and the second end. Preferably, the second end is a free end. The method also includes providing the AFM tip structure along a first portion of a substrate comprising a plurality of carbon based nanotube structures thereon. The method includes attaching at least one of the carbon based nanotube structure from the plurality of carbon based nanotube structures from the substrate along a portion of the length of the AFM tip structure to extend a total length of the AFM structure to include the length of the AFM tip structure and a first length associated with the carbon based nanotube structure. The method provides the AFM tip structure including the carbon based nanotube structure along a second portion of the substrate and applies applying an electrical bias between the AFM tip structure and a substrate (e.g., electrically grounded or other reference potential) to cause a reducing of the carbon based nanotube structure from the first length to a second length. In a preferred embodiment, the substrate can be conductive doped-silicon or oxidized doped-silicon or gold plated or otherwise made somewhat electrically conductive. The method also provides the AFM tip structure including the carbon based nanotube structure of the second length to a third portion of the substrate. The method forces the carbon based nanotube structure in a direction parallel to the second length using the third portion of the substrate to reduce the second length to a third length of the carbon based nanotube structure using a pushing action along the direction parallel to the second length to cause the carbon based nanotube structure to move along a portion of the length of the AFM tip structure.

In yet an alternative embodiment, the invention provides a method for fabricating assembled structures. The method includes providing a tip structure, which has a first end, a second end, and a length defined between the first end and the second end. The second end is a free end. The method includes attaching a nano-sized structure along a portion of the length of the tip structure to extend a total length of the tip structure to include the length of the tip structure and a first length associated with the nano-sized structure. The method includes shortening the nano-sized structure from the first length to a second length. The method also includes pushing the nano-sized structure in a direction parallel to the second length to reduce the second length to a third length of the nano-sized structure along the direction parallel to the second length to cause the nano-sized structure to move along a portion of the length of the tip structure.

In yet an alternative specific embodiment, the present invention provides a method for assembling carbon based nanotubes. The method includes providing a tip structure, which has a first end, a second end, and a length defined between the first end and the second end. Preferably, the second end is a free end. the method includes moving the tip structure along a first region comprising a plurality of carbon based nanotube structures thereon. The method also includes attaching at least one of the carbon based nanotube structure from the plurality of carbon based nanotube structures from the first region along a portion of the length of the tip structure to extend a total length of the tip structure to include the length of the tip structure and a first length associated with the carbon based nanotube structure. The method includes moving the tip structure including the carbon based nanotube structure along a second region. The method includes applying an electrical bias between the tip structure and a substrate (e.g., electrically grounded or other substrate potential) to cause a reducing of the carbon based nanotube structure from the first length to a second length. In a preferred embodiment, the substrate can be conductive doped-silicon or oxidized doped-silicon or gold plated or otherwise made somewhat electrically conductive. A step of removing the tip structure including the attached carbon based nanotube structure is also included. The method repeats the above elements of providing a tip structure; moving the tip structure along a first region comprising a plurality of carbon based nanotube structures thereon; attaching at least one of the carbon based nanotube structure; moving the tip structure including the carbon based nanotube structure along a second region; applying an electrical bias between the tip structure and a substrate (e.g., electrically grounded or other reference potential) to cause a reducing of the carbon based nanotube structure from the first length to a second length; and removing the tip structure including the attached carbon based nanotube structure for N repetitions, whereupon N is 1 or greater or greater than 10; and repeating the above elements at a rate of M repetitions whereupon M equal to N divided by hours, whereupon M is an integer greater than three.

In a specific embodiment, the present invention provides a system for manufacturing nanotubes. The system has a member, e.g., beam. The system has a tip structure (e.g., AFM) coupled to the member. Preferably, the tip structure includes a first end, a second end, and a length defined between the first end and the second end, while the second end is a free end. A first region comprising a plurality of nanotube structures is preferably on a substrate. The first region is within a vicinity of the tip structure. At least one of the nanotube structures from the plurality of nanotube structures from the first region is attached along a portion of the length of the tip structure to extend a total length of the tip structure to include the length of the tip structure and a first length associated with the nanotube structure. A second region within a vicinity of the tip structure including the nanotube structure is preferably on the substrate. A power source is coupled to the tip structure. The power source is adapted to apply an electrical bias between the tip structure at the end of the first length associated with the nanotube structure and the second region, which is preferably at electrical ground or other reference potential, to cause a reducing of the nanotube structure from the first length to a second length. A third region is within a vicinity of the tip structure including the nanotube structure of the second length. The nanotube structure is forced in a direction parallel to the second length using the third region to reduce the second length to a third length of the nanotube structure using a pushing action along the direction parallel to the second length to cause the carbon based nanotube structure to move along a portion of the length of the tip structure.

Numerous benefits can be achieved using the present invention over conventional techniques. As merely an example, the present invention can provide an AFM-tip structure that is sharp to allow for a tip feature size of about ¹/₁₀ of an Angstrom and less. Preferably, a smaller tip size provides for better resolution. In certain embodiments, the present invention can overcome certain limitations of silicon based nanotubes, which often wear down and break after use. In preferred embodiments, the invention provides for carbon based nanotubes that are hard and difficult to wear down. In certain embodiments, the carbon based nanotubes include a dimension ranging from about 1–6 nanometers in diameter as single walled structures. Preferably, the nanotubes can be used with various AFM modes including contact mode, tapping mode (50 to 300 kHz) while scanning at 1 Hertz, and others. The present manufacturing technique can also lead to improved throughput, efficiency, and yield. Depending upon the embodiment, one or more of these benefits may be achieved. These and other benefits are described throughout the present specification and more particularly below.

From the above, it is seen that techniques for improving ways to manufacturing probe designs for microscopes are highly desired.

DETAILED DESCRIPTION OF THE INVENTION

Figure 1:
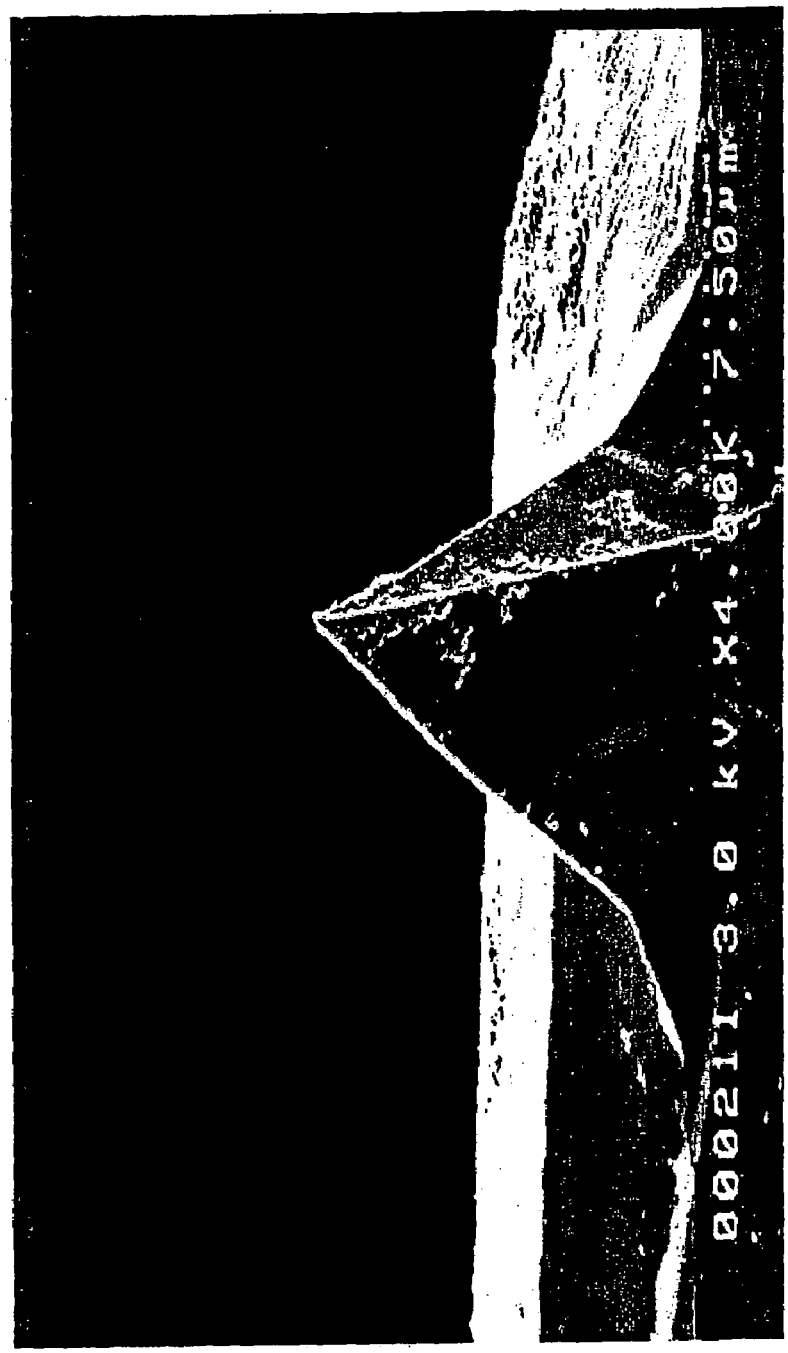
FIG. 1 is a simplified cross-sectional view diagram of a nanotube structure for an AFM probe according to an embodiment of the present invention.

The present invention relates generally to manufacture of materials such as nano-sized structures. More particularly, the present invention provides a method and structure for fabricating a nanotube based structure comprising an electrical shortening technique and mechanical forming technique to manufacture carbon based nanotube structures having a desired length. Merely by way of example, the invention has been applied to an atomic force microscope, but it would be recognized that the invention has a much broader range of applicability. For example, the invention can be applied to fluorescent atomic force microscope, commonly called FANSOM, other instrumentation, electronic devices, biological devices, and others. Additionally, the device(s) and applications can be from a variety of different fields such as electronics, semiconductor, inorganic chemistry, organic chemistry, life sciences, petroleum, biotechnology, financial, and others.

A method for manufacturing carbon based nanotubes for AFM applications according to an embodiment of the present invention may be outlined as follows:

1. Provide an AFM tip structure, which has a first end, a second end, and a length defined between the first end and the second end, e.g., a free end;
2. Provide the AFM tip structure along a first portion of a substrate comprising a plurality of carbon based nanotube structures thereon;
3. Attach at least one of the carbon based nanotube structure from the plurality of carbon based nanotube structures from the substrate along a portion of the length of the AFM tip structure to extend a total length of the AFM structure to include the length of the AFM tip structure and a first length associated with the carbon based nanotube structure;
4. Provide the AFM tip structure including the carbon based nanotube structure along a second portion of the substrate and applies applying an electrical bias between the AFM tip structure and an electrically grounded substrate at the end of the first length associated with the carbon based nanotube structure to cause a reducing of the carbon based nanotube structure from the first length to a second length. The substrate can be conductive doped-silicon or oxidized doped-silicon or gold plated or otherwise made somewhat electrically conductive in a specific embodiment;
5. Provide the AFM tip structure including the carbon based nanotube structure of the second length to a third portion of the substrate;
6. Force the carbon based nanotube structure in a direction parallel to the second length using the third portion of the substrate to reduce the second length to a third length of the carbon based nanotube structure using a pushing action along the direction parallel to the second length to cause the carbon based nanotube structure to move along a portion of the length of the AFM tip structure; and 7. Perform other steps, as desired.

The above sequence of steps provides a method according to an embodiment of the present invention. As shown, the method uses a combination of steps including a way of forming a carbon based nanotube probe for AFM applications. Other alternatives can also be provided where steps are added, one or more steps are removed, or one or more steps are provided in a different sequence without departing from the scope of the claims herein. Additionally, the present method can be applied to other applications that are not for AFM techniques. Further details of the present method can be found throughout the present specification and more particularly below.

FIG. 1 is a simplified cross-sectional view diagram of a nanotube structure 100 for an AFM probe according to an embodiment of the present invention. This diagram is merely an example, which should not unduly limit the scope of the claims herein. One of ordinary skill in the art would recognize many variations, alternatives, and modifications. As shown, the AFM probe is characterized by a tip structure. The tip structure is often made of silicon bearing species. The silicon bearing species is from a silicon wafer. The tip structure has a pyramid-like shape that protrudes from a base to an end, as shown. The tip structure has a nanotube base structured coupled thereon. The nanotube structure includes a selected length and width. The length is often less than 200 nanometers and less or less than 100 nanometers, but can also be other dimensions depending upon the application. That is, certain application may include a length of more than 1 micron depending upon the embodiment. Preferably, the nanotube structure is from a carbon based nanotube or other like materials. Details on a method for fabricating the nanotube structure can be found throughout the present specification and more particularly below.

Figure 2:
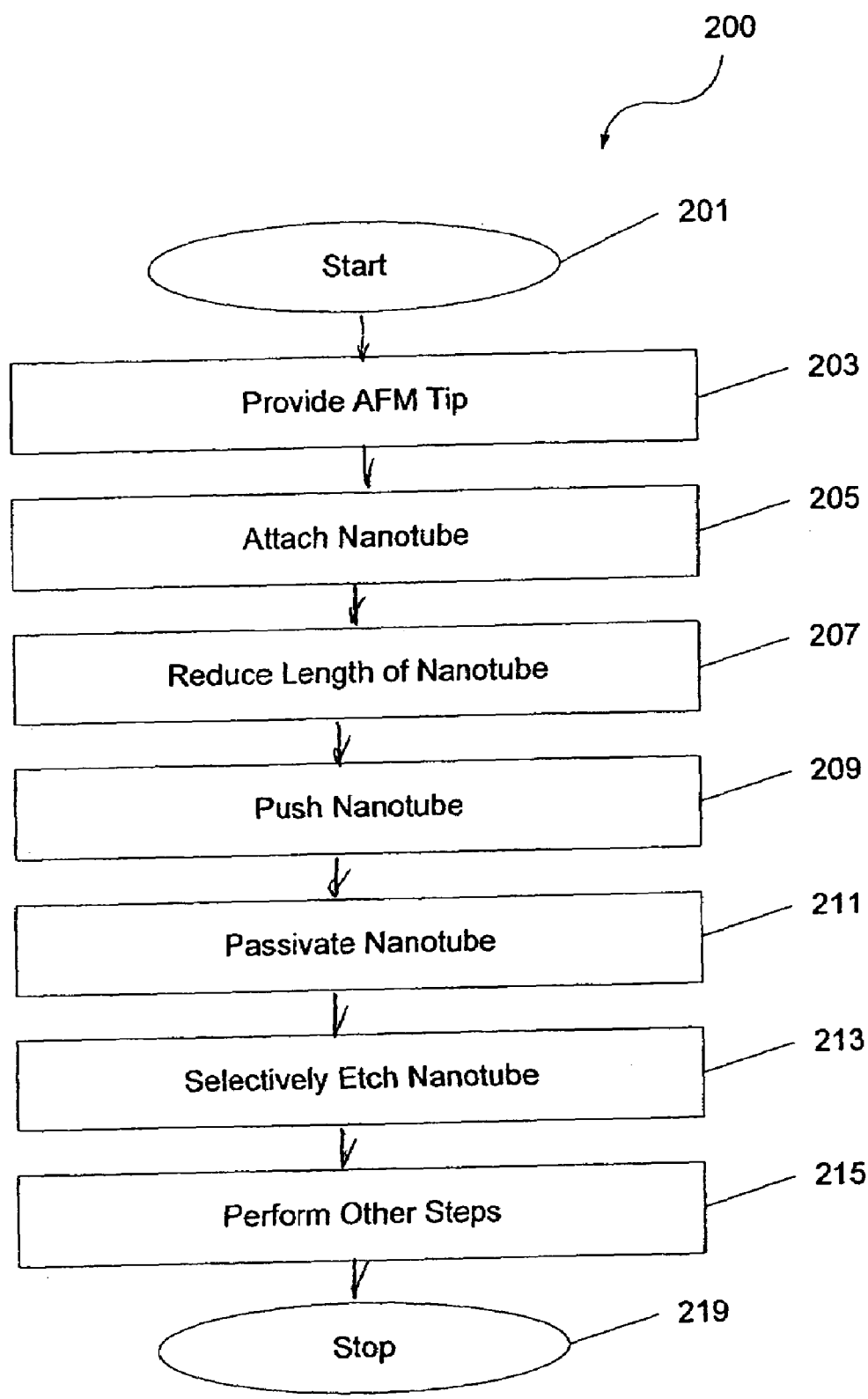
FIG. 2 is a simplified flow diagram illustrating a method for manufacturing an AFM probe according to an embodiment of the present invention.

FIG. 2 is a simplified flow diagram illustrating a method 200 for manufacturing an AFM probe according to an embodiment of the present invention. This diagram is merely an example, which should not unduly limit the scope of the claims herein. One of ordinary skill in the art would recognize many variations, alternatives, and modifications. The present invention provides a method for fabricating carbon based nanotubes for atomic force microscope ("AFM") applications, as shown. The method includes providing (step 203) an AFM tip structure, which includes a first end, a second end, and a length defined between the first end and the second end. Preferably, the second end is a free end that protrudes into free space and is free from mechanical attachment.

The method also includes attaching (step 205) a carbon based nanotube structure along a portion of the length of the AFM tip structure. The combination of the AFM tip structure and nanotube structure yields a total length of the AFM structure to include the length of the AFM tip structure and a first length associated with the carbon based nanotube structure. The first length of the nanotube structure can be greater than 100 nanometers, but can also be other lengths, depending upon the embodiment.

Preferably, attachment of the nanotube structure occurs using at least attractive forces between the AFM tip structure and the nanotube structure. The attractive forces often include Van der Waal's forces, but can also include other types of forces such as covalent and the like, as well as combination of these forces. Here, a portion of the nanotube structure adheres to a portion of the AFM tip structure. Preferably, the nanotube structure is in parallel with a lengthy of the AFM tip structure, but can also be at other spatial configurations. Once the carbon nanotube has been attached, the method performs other steps, as described more fully below.

The method includes applying (step 207) an electrical bias between the AFM tip structure and an electrically grounded substrate at the end of the first length associated with the carbon based nanotube structure to cause a reducing of the carbon based nanotube structure from the first length to a second length. Preferably, the substrate can be conductive doped-silicon or oxidized doped-silicon or gold plated or otherwise made somewhat electrically conductive. The electrical bias can cause a reducing of the carbon based nanotube structure from the first length to a second length. In a specific embodiment using carbon nanotubes, the electrical bias can range from about 3 volts to about 50 volts, although others may be used. The electrical bias can be pulsed using one or more pulses. Each of the pulses can be relatively short in duration. The duration can range from about 100 microseconds and less. Depending upon the embodiment, there can be various lengths. For example, the first length can be greater than about 200 nanometers. The second length can range from 80 to 120 nanometers, but can be others. The method finishes the length of the nanotube structure by pushing the cut length down using mechanical force, as described below.

The method also forces (step 209) the carbon based nanotube structure in a direction parallel to the second length. The force reduces the second length to a third length of the carbon based nanotube structure using a pushing action along the direction parallel to the second length to cause the carbon based nanotube structure to move along a portion of the length of the AFM tip structure. Preferably, the third length is less than 100 nanometers, but can be at other lengths. The method forces the nanotube structure by pressing on an end of the structure. The forces are similar to those of driving a nail into a piece of wood using a hammer. The AFM tip structure can be actuated in the direction parallel to the second length.

The method includes passivating the nanotube structure, step 211. Next, the method selectively removes (step 213) a predetermined portion of the passivation to free a portion of the nanotube structure. Further details of these steps can be found in U.S. Ser. No. 10/783,713 filed Feb. 20, 2004, which is CIT-3851), commonly assigned, and hereby incorporated by reference for all purposes.

Depending upon the embodiment, other steps can also be performed, step 215. The method stops, step 219. As shown, the method uses a combination of steps including a way of forming a carbon based nanotube probe for AFM applications. Other alternatives can also be provided where steps are added, one or more steps are removed, or one or more steps are provided in a different sequence without departing from the scope of the claims herein. Additionally, the present method can be applied to other applications that are not for AFM techniques. Further details of the present method can be found throughout the present specification and more particularly below.

Figure 3:
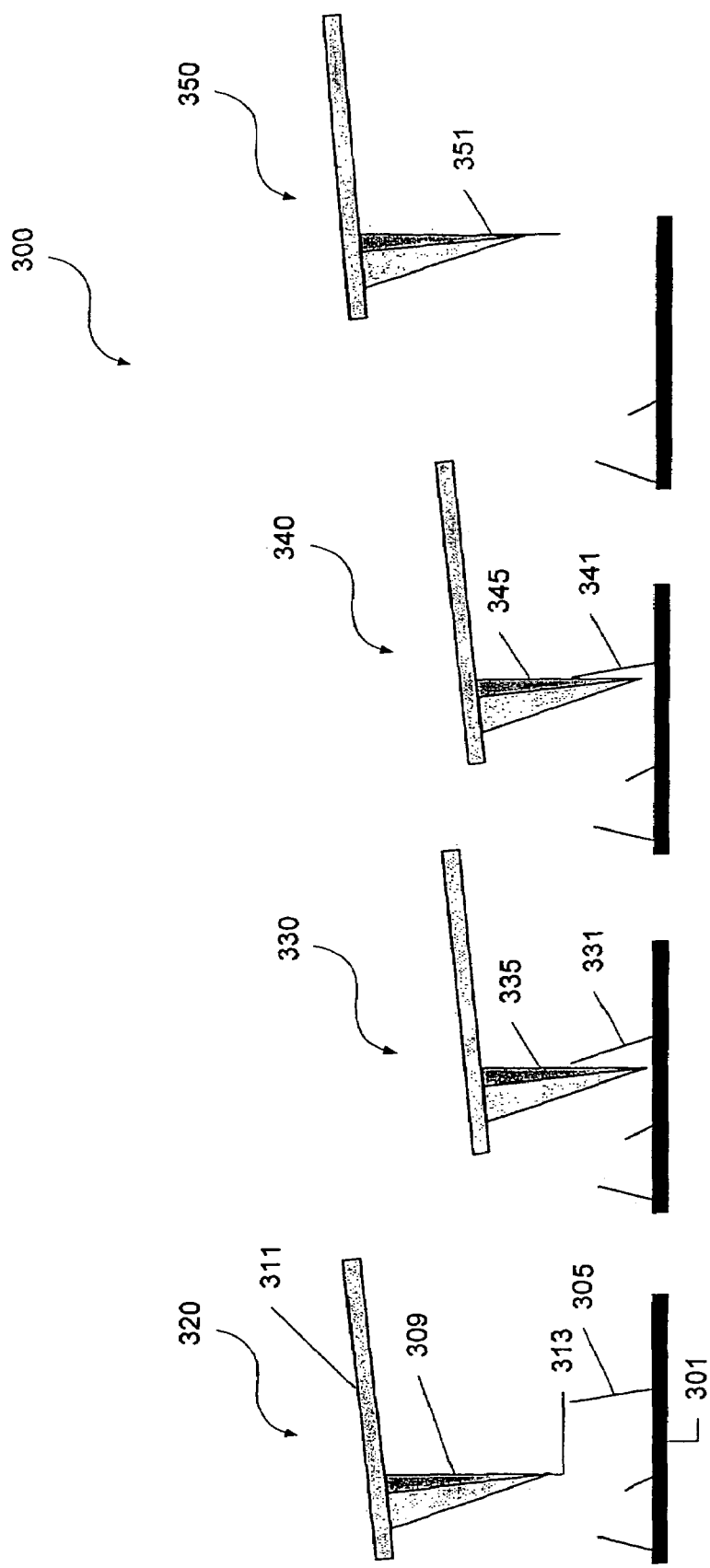
FIG. 3 is a simplified diagram illustrating a method for picking up a carbon-based nanotube according to an embodiment of the present invention.

FIG. 3 is a simplified diagram illustrating a method 300 for picking up a carbon-based nanotube according to an embodiment of the present invention. This diagram is merely an example, which should not unduly limit the scope of the claims herein. One of ordinary skill in the art would recognize many variations, alternatives, and modifications. As shown, the method includes AFM tip structure 309. The tip structure includes a protruding end 313 that is free. The tip structure is coupled to arm structure 311. The tip and arm structures are spatially disposed adjacent to a substrate including a plurality of carbon based nanotube structures, as illustrated by reference numbers 320, 330, 340, and 350. The substrate can be made using a variety of techniques including chemical vapor deposition, and the like. More particularly, the method provides the AFM tip structure along a first portion 301 of the substrate comprising the plurality of carbon based nanotube structures 305 thereon. The method includes attaching at least one 331 of the carbon based nanotube structure from the plurality of carbon based nanotube structures from the substrate along a portion 335 of the length of the AFM tip structure. The method uses attractive forces between the nanotube structure 341 and AFM tip structure 345. The attracted nanotube structure extends a total length of the AFM structure to include the length of the AFM tip structure and a first length associated with the carbon based nanotube structure, as illustrated by reference numeral 351. Of course, there can be other variations, modifications, and alternatives.

Figure 4:
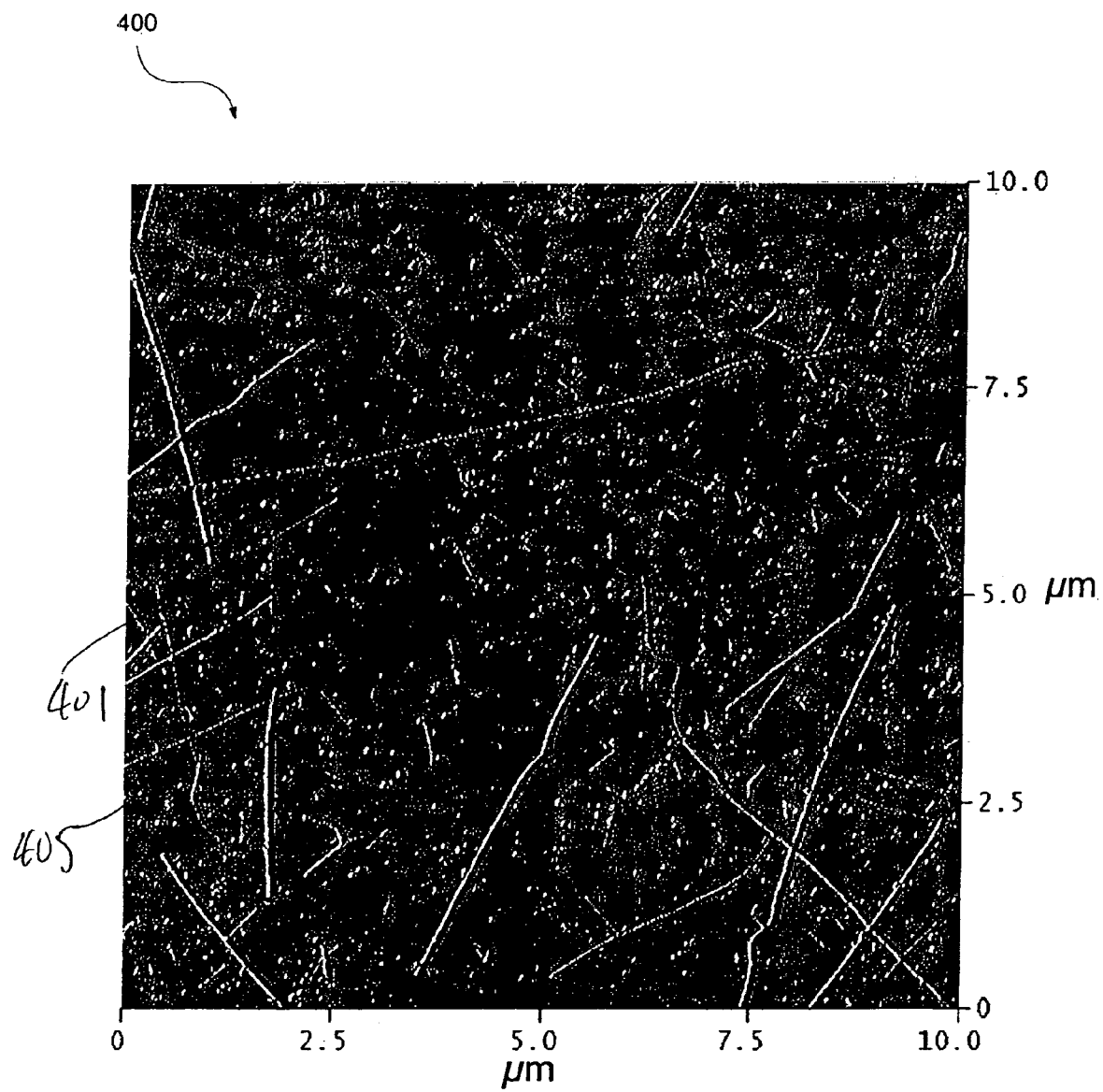
FIG. 4 illustrates a substrate comprising a plurality of nanotubes according to an embodiment of the present invention.

FIG. 4 illustrates a substrate 400 comprising a plurality of nanotubes 401, 405 according to an embodiment of the present invention. This diagram is merely an example, which should not unduly limit the scope of the claims herein. One of ordinary skill in the art would recognize many variations, alternatives, and modifications. As shown, the plurality of nanotubes are carbon based. The nanotube structures have been grown using chemical vapor deposition techniques. Further details of these techniques can be found throughout the present specification and more particularly below.

Figure 5:
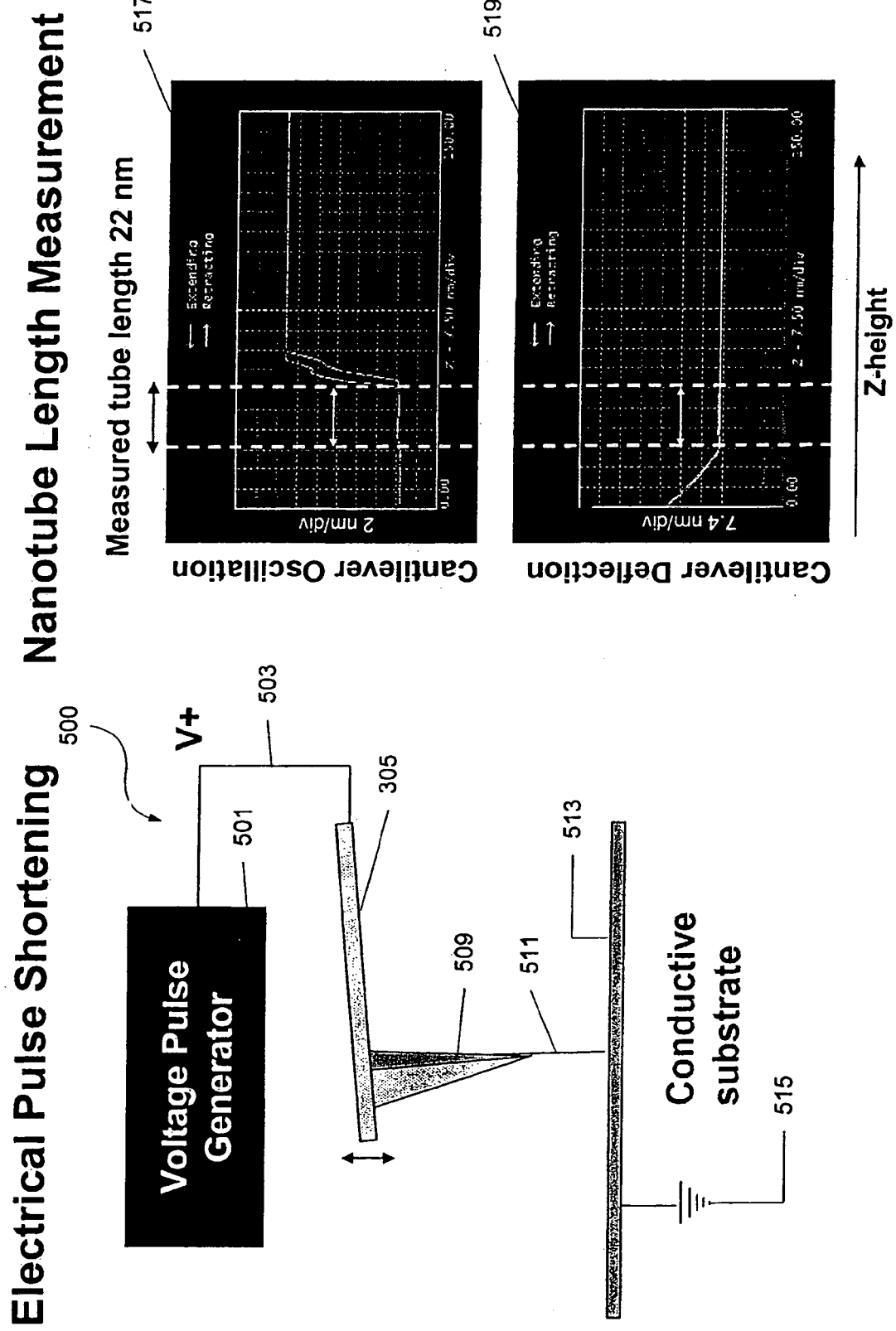
FIG. 5 is a simplified diagram illustrating a method for shortening a carbon-based nanotube according to an embodiment of the present invention.

FIG. 5 is a simplified diagram illustrating a method 500 for shortening a carbon-based nanotube according to an embodiment of the present invention. This diagram is merely an example, which should not unduly limit the scope of the claims herein. One of ordinary skill in the art would recognize many variations, alternatives, and modifications. As shown, the method includes providing an AFM tip structure 509 coupled to arm structure 505. The arm structure is electrically connected to the AFM tip structure. The arm structure is electrically biased 501 via line 503 using a voltage pulse generator. Preferably, the method applies an electrical bias between the AFM tip structure and an electrically grounded substrate at the end of the first length associated with the carbon based nanotube structure to cause a reducing of the carbon based nanotube structure from the first length to a second length. Preferably, the substrate can be conductive doped-silicon or oxidized doped-silicon or gold plated or otherwise made somewhat electrically conductive. According to a specific embodiment, the arm structure moves the tip of the nanotube onto the conductive substrate 531, which is maintained at a ground potential 515. The difference in voltage causes the nanotube structure to reduce in length or ablate depending upon the embodiment.

In a specific embodiment using carbon nanotubes, the electrical bias can range from about 3 volts to about 50 volts, although others may be used. The electrical bias can be pulsed using one or more pulses. Each of the pulses can be relatively short in duration. The duration can range from about 100 micro-seconds and less. Depending upon the embodiment, there can be various lengths. For example, the first length can be greater than about 200 nanometers. The second length can range from 80 to 120 nanometers, but can be others. The method finishes the length of the nanotube structure by pushing the cut length down using mechanical force, as described below. Preferably, the force caused by pushing is parallel to the length of the nanotube structure according to a specific embodiment.

Figure 6:
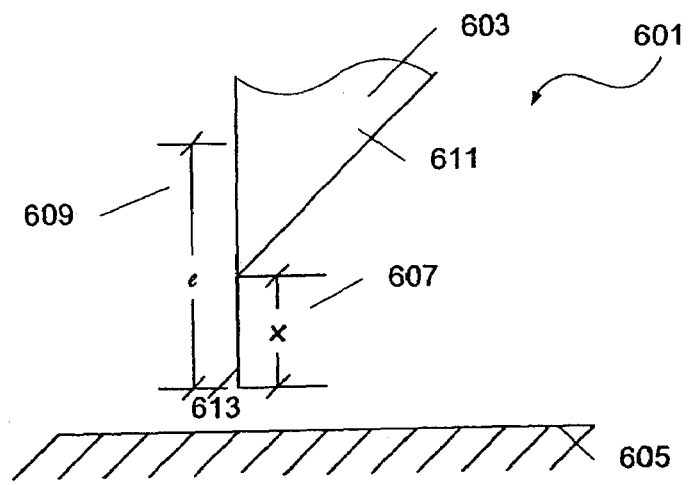
FIG. 6 is a simplified diagram illustrating a method for pushing a carbon based nanotube according to an embodiment of the present invention.
Figure 6:
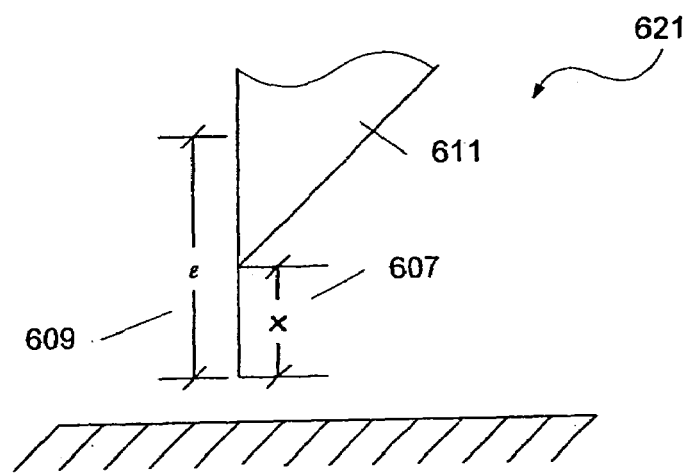
Figure 6:
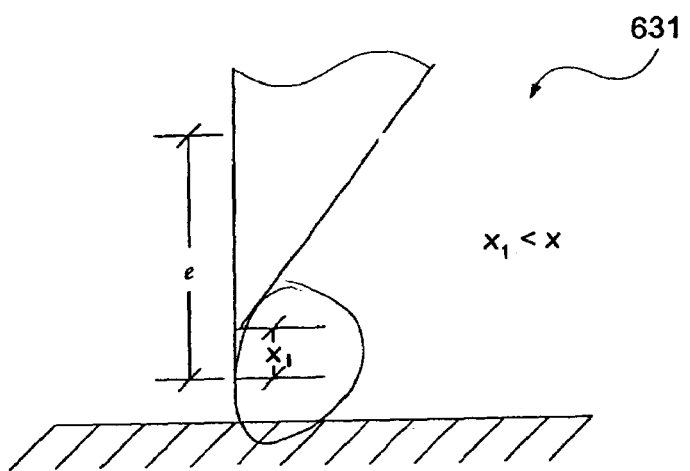

FIG. 6 is a simplified diagram illustrating a method 601, 621, 631 for pushing a carbon based nanotube according to an embodiment of the present invention. This diagram is merely an example, which should not unduly limit the scope of the claims herein. One of ordinary skill in the art would recognize many variations, alternatives, and modifications. As shown, the method provides the AFM tip structure 611 including the carbon based nanotube structure 613 of a second length 607 to a third portion 606 of the substrate. As shown, the nanotube structure has total length 609 along a portion of the AFM tip structure. The AFM tip structure comprises silicon bearing material 603.

The method moves the AFM tip structure including nanotube toward the surface of the substrate, as shown by reference numeral 621. The tip or end of the nanotube structure is normal to the surface of the substrate. Preferably, the length of the nanotube structure is also normal to the surface of the substrate. As shown via reference numeral 631, the method forces the carbon based nanotube structure in a direction parallel to the second length using the third portion of the substrate to reduce the second length to a third length of the carbon based nanotube structure using a pushing action along the direction parallel to the second length. The pushing action causes the carbon based nanotube structure to move along a portion of the length of the AFM tip structure. The third length is defined as $x_1$, which is less than x. Preferably for the carbon based nanotube structure, the third length is less than 100 nanometers but can be at other dimensions, depending upon the application. Further details of the present method and system can be found throughout the present specification and more particularly below.

Figure 6A:
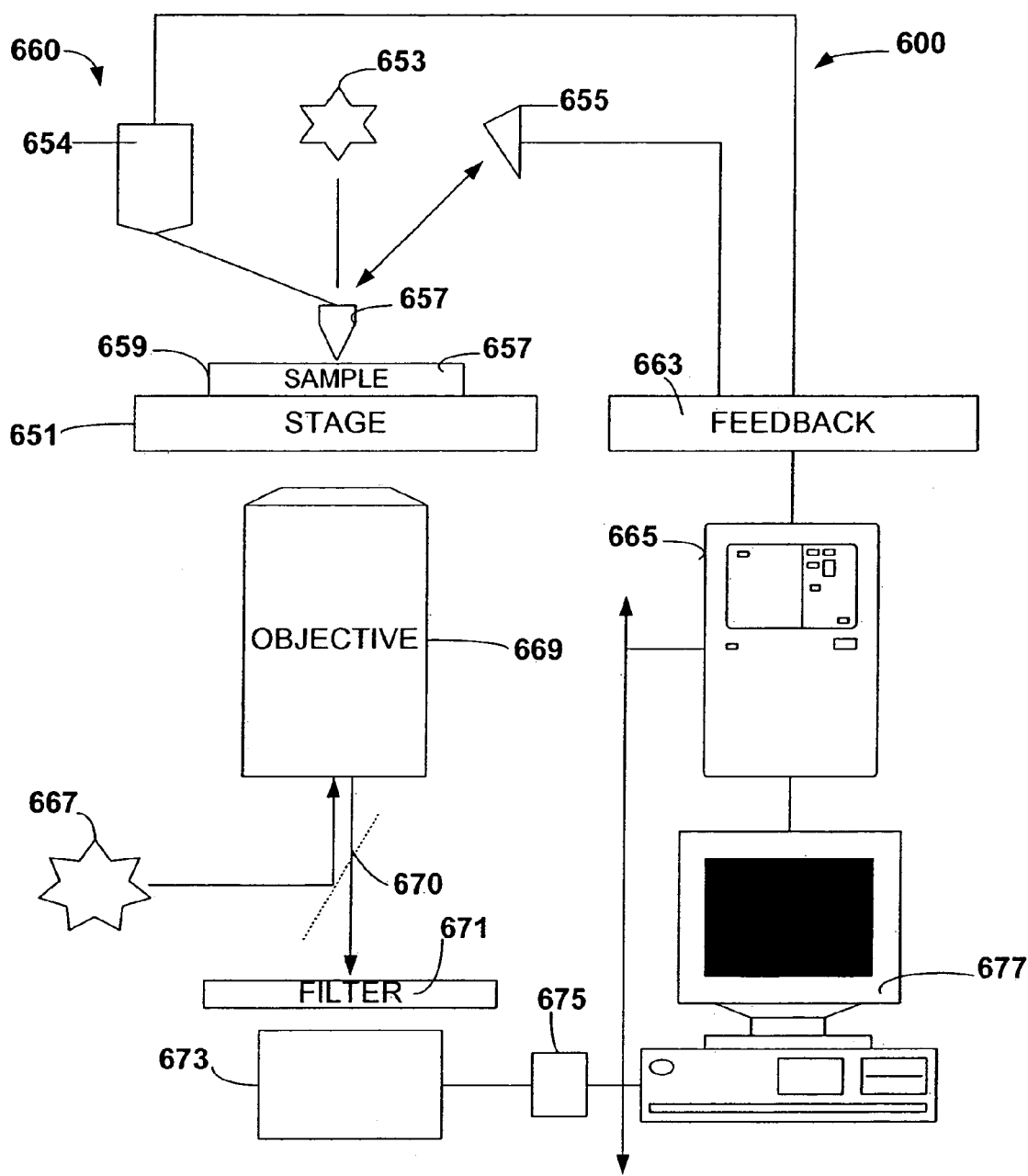
FIG. 6A is a simplified diagram of a system for manufacturing nanotube structures according to an embodiment of the present invention.

FIG. 6A is a simplified diagram of a scanning system 650 according to an embodiment of the present invention. This diagram is merely an example, which should not unduly limit the scope of the claims herein. One of ordinary skill in the art would recognize many other modifications, alternatives, and variations. As shown, the present microscope system 650 includes a mobile stage 651, which has x-y-z movement capability. The stage can be moved with a tolerance of less than 40 microns for sample positioning and when used for alignment can be moved with a tolerance of <1 nm. A sample 659 is placed on the stage. Depending upon the application, the sample can include the present substrate with a plurality of carbon nanotube structures thereon. Preferably, the sample can also be in liquids, air, inert gas environments, or in vacuum and at specific temperatures (cryogenic, room temperature, warm to extremely high temperatures), depending upon the application.

The system also includes a tapping mode atomic force microscope ("AFM") 660. In a specific embodiment, the AFM 660 has various elements such as probe 657, a cantilever to support the probe, which is coupled to a piezo-electric stack 654. Such piezo-stack provides for dithering and z-motion of the cantilever. The AFM also includes a driving signal, which is coupled to control electronics 663 for signal detection and correction. Preferably, probe 657 has a pyramidal shape and the tip of the pyramid is coated with silver particles. In the present embodiment, the tip includes the nanotube structure to be pushed and/or attached thereon. The AFM also includes a laser source 653, which is directed to the cantilever or probe. The laser source is used as a position detector, which provides photons that scatter off of the cantilever and/or probe. Such scattered photons are detected by way of photodetector 655, which is coupled to control electronics 663. The AFM may be coupled to an inverted optical microscope, as shown, and further described in co-pending application Ser. No. 10/616,896 filed Jul. 9, 2003, commonly assigned, and hereby incorporated by reference herein.

Preferably, the inverted optical microscope 669 is underlying the AFM, as shown. A laser beam 667 (which in a specific embodiment is from a green HeNe 667 source) is focused on the AFM tip. The laser beam is directed from the source 667 and is adjusted by way of dichroic mirror 670 through the objective 669, which focuses the beam onto the AFM tip. As the sample is scanned in the x-y plane (which is also in the plane of the paper), fluorescent photons emit from the sample. Such photons pass through the objective through a bandpass filter 671 and are detected by an avalanche photodiode 673. A gated photon counter 675, which is coupled to the photodiode, processes the detected photons. The gated photon counter is triggered by a measured height of an AFM cantilever. A signal acquisition and processing apparatus 665 (which includes a microprocessor device and has been used as a "controller" and/or "main controller" herein without unduly limiting the scope of the term processing apparatus), which may be coupled to the counter through a common bus, oversees and performs operation and processing of information. The system also has a display 677, which can be a computer, coupled to the signal acquisition and processing apparatus. The signal acquisition and processing apparatus is also coupled to the control electronics of the AFM as shown. Of course, there can be other modifications, alternatives, and variations. Further details of the present system can be found in the Quake patent, which has been previously described. Other details of the present system and methods are provided throughout the specification and more particularly below.

Figure 6B:
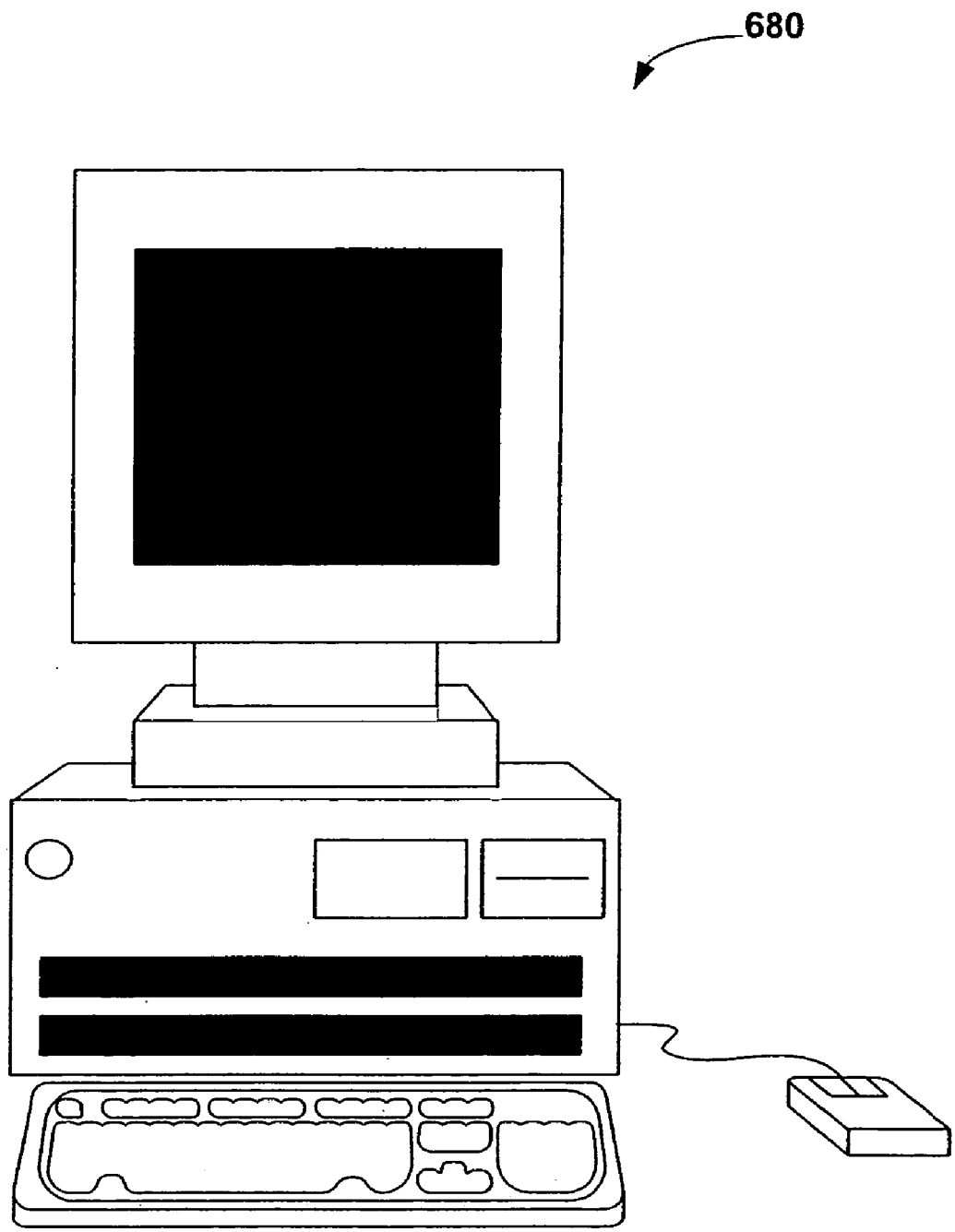
FIG. 6B is a simplified diagram of a computer system according to an embodiment of the present invention.

FIG. 6B is a simplified diagram of a computer system 680 that is used to oversee the system of FIG. 6A according to an embodiment of the present invention. This diagram is merely an example, which should not unduly limit the scope of the claims herein. One of ordinary skill in the art would recognize many other modifications, alternatives, and variations. As shown, the computer system includes display device, display screen, cabinet, keyboard, scanner and mouse. Mouse and keyboard are representative "user input devices." Mouse includes buttons for selection of buttons on a graphical user interface device. Other examples of user input devices are a touch screen, light pen, track ball, data glove, microphone, and so forth.

The system is merely representative of but one type of system for embodying the present invention. It will be readily apparent to one of ordinary skill in the art that many system types and configurations are suitable for use in conjunction with the present invention. In a preferred embodiment, computer system 680 includes a Pentium™ class based computer, running Windows™ NT operating system by Microsoft Corporation or Linux based systems from a variety of sources. However, the system is easily adapted to other operating systems and architectures by those of ordinary skill in the art without departing from the scope of the present invention. As noted, mouse can have one or more buttons such as buttons. Cabinet houses familiar computer components such as disk drives, a processor, storage device, etc. Storage devices include, but are not limited to, disk drives, magnetic tape, solid-state memory, bubble memory, etc. Cabinet can include additional hardware such as input/output (I/O) interface cards for connecting computer system to external devices external storage, other computers or additional peripherals, which are further described below.

Figure 6C:
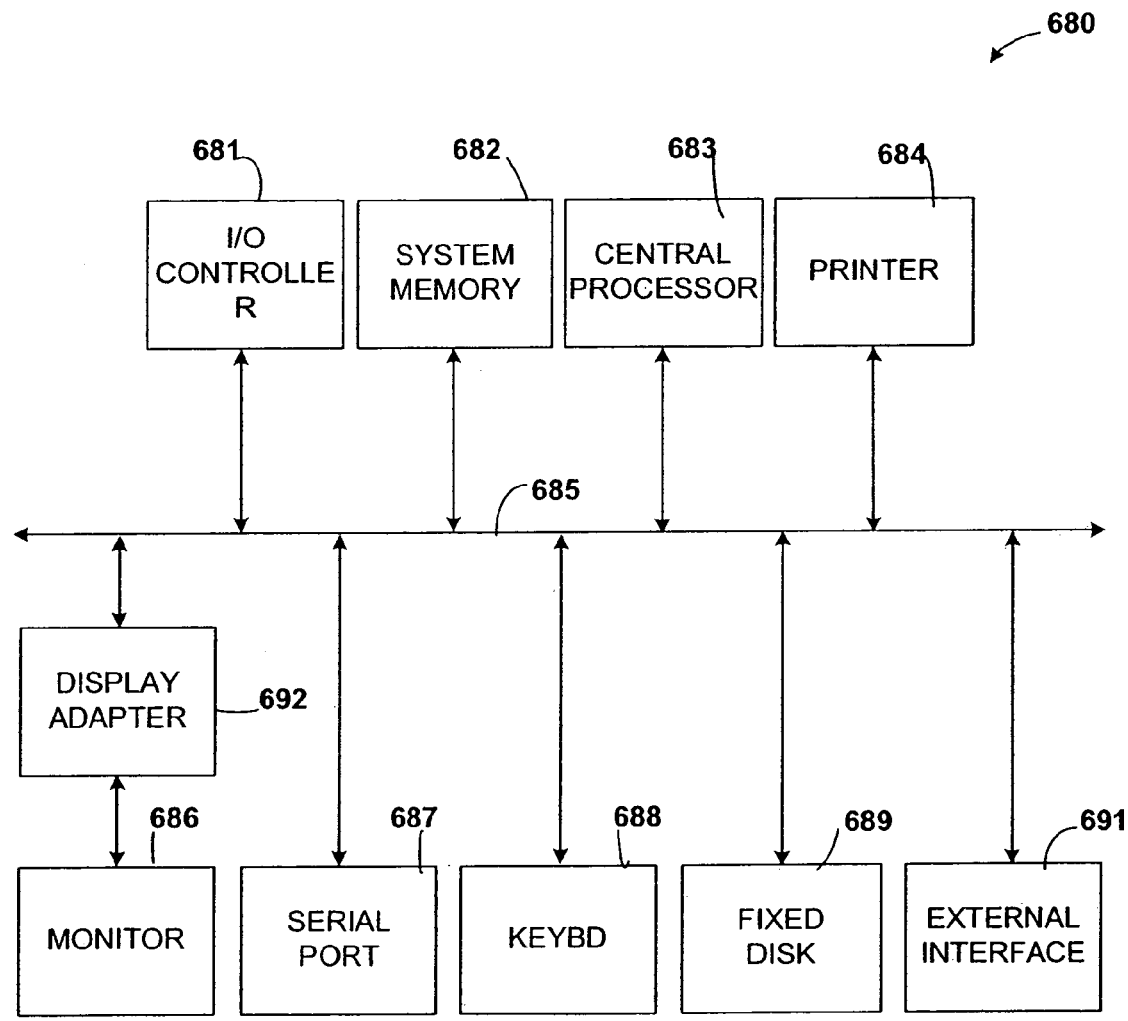
FIG. 6C is a simplified block diagram of a computer system according to an embodiment of the present invention.

FIG. 6C is a more detailed diagram of hardware elements in the computer system according to an embodiment of the present invention. This diagram is merely an example, which should not unduly limit the scope of the claims herein. One of ordinary skill in the art would recognize many other modifications, alternatives, and variations. As shown, basic subsystems are included in computer system 680. In specific embodiments, the subsystems are interconnected via a system bus 685. Additional subsystems such as a printer 684, keyboard 688, fixed disk 689, monitor 686, which is coupled to display adapter 692, and others are shown. Peripherals and input/output (I/O) devices, which couple to I/O controller 681, can be connected to the computer system by any number of means known in the art, such as serial port 687. For example, serial port 687 can be used to connect the computer system to a modem 691, which in turn connects to a wide area network such as the Internet, a mouse input device, or a scanner. The interconnection via system bus allows central processor 683 to communicate with each subsystem and to control the execution of instructions from system memory 682 or the fixed disk 689, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Further details of certain experimental results can be found throughout the present specification and more particularly below.

Experiments:

To prove the principles and operation of the present invention, we performed various experiments. These experiments have been used to demonstrate the invention and certain benefits associated with the invention. As experiments, they are merely examples, which should not unduly limit the scope of the claims herein. One of ordinary skill in the art would recognize many variations, alternatives, and modifications. Details of these experiments are provided below.

As noted, single-wall carbon nanotubes have shown great potential as high-resolution AFM imaging probes. The level of resolution possible for both single molecule imaging and force transduction in AFM is ultimately limited by the structure of the tip. Commercially available silicon probe tips have radii of curvature of 5–15 nm. The finest commercially available Si tips are very delicate, leading to substantial variation in tip shape and size even between successive images. SWNTs, on the other hand, have diameters between 1.5 and 6 nm, providing resolution comparable to molecular scale dimensions. Carbon nanotubes are chemically and mechanically robust, with axial Young's moduli of about 1.25 TPa, resulting in a tip structure that is stable over prolonged imaging periods. Finally, SWNTs can be chemically functionalized uniquely at their very ends, permitting a broad array of applications in nanotechnology and biotechnology. Nevertheless, it is difficult to reproducibly assemble large quantities of high-quality single-wall nanotube AFM tips. To fully realize the promise of these probes for high-resolution AFM, a better physical understanding is needed of how the geometry of the mounted SWNT on its AFM tip support affects image quality.

Successfully fabricating a probe suitable for AFM imaging in air involves several steps: attaching the nanotube to a silicon AFM tip, shortening it sufficiently to enable high resolution imaging, characterizing its quality, and storing it for later use. Building upon previously reported techniques, we have conducted a comparative survey of fabrication methods to produce a protocol that routinely results in high quality probes. The quality of the AFM images taken with the resultant probes, along with the frequency and ease of success, was used to distinguish between the several approaches studied. In addition, SEM and TEM images of hundreds of nanotube AFM probes were used to evaluate the efficacy of different probe attachment and shortening techniques and to improve the accuracy of our interpretation of AFM imaging and force calibration results. For the first time, the AFM resolution achieved when imaging with nanotube probes was directly correlated to TEM images taken of these same probes. This allowed us to carry out a rigorous examination of nanotube morphology and its influence on image resolution and quality, by directly correlating nanotube geometry, as determined with TEM imaging, with their performance as AFM probes. As a result, we gained significant new insights that are important for research groups performing AFM imaging with SWNT tips.

We summarized the results of these studies and describe a procedure that enables consistently successful nanotube probe fabrication. The lateral resolution of these probes when used to image 3 nm diameter SWNTs was typically less than 4 mm, and in one case, 5 Å. This is an improvement by a factor of 4 over the best resolution reported to date using a SWNT probe, which is 2.0 mm. The systematic correlation of TEM images of SWNT probes with the effective lateral resolution obtained when using these probes for topographical imaging indicates that approximately one-third of the probes demonstrated resolution smaller than the diameter of the nanotube probe itself when imaging nanotubes on a smooth substrate. For example, we have measured 1.2 nm lateral resolution from a SWNT scanning probe that was 5.5 nm in diameter.

These TEM-AFM correlations provide experimental evidence consistent with previous mechanical modeling carried out by Snow, et al. Additionally, whereas previous investigations have shown nanotube buckling to be an elastic process, we have found that under some circumstances, a SWNT probe can buckle inelastically, resulting in probe damage and corresponding image artifacts.

Finally, we have found (L. A. Wade, I. R. Shapiro, Z. Ma, S. R. Quake, C. P. Collier, Nano Lett. 2004, 4, 725–731.) that nanotubes picked up by AFM tips can have larger diameters (by about a factor of 2) than the diameters of nanotubes imaged on the surface of the growth substrate, as determined from height measurements with a conventional AFM tip. A better understanding of this discrepancy is needed for optimizing the yield and reproducibility of nanotube probe fabrication. The AFM image resolution statistics we report here underscore the variability between probes fabricated by different methods.

Digital Instruments BioScope and Multimode atomic force microscopes were used with Nanoscope IV controllers for this work. Transmission electron microscopy was performed with a Phillips EM430, and scanning electron microscopy was performed with a Hitachi 4100.

Figure 7:
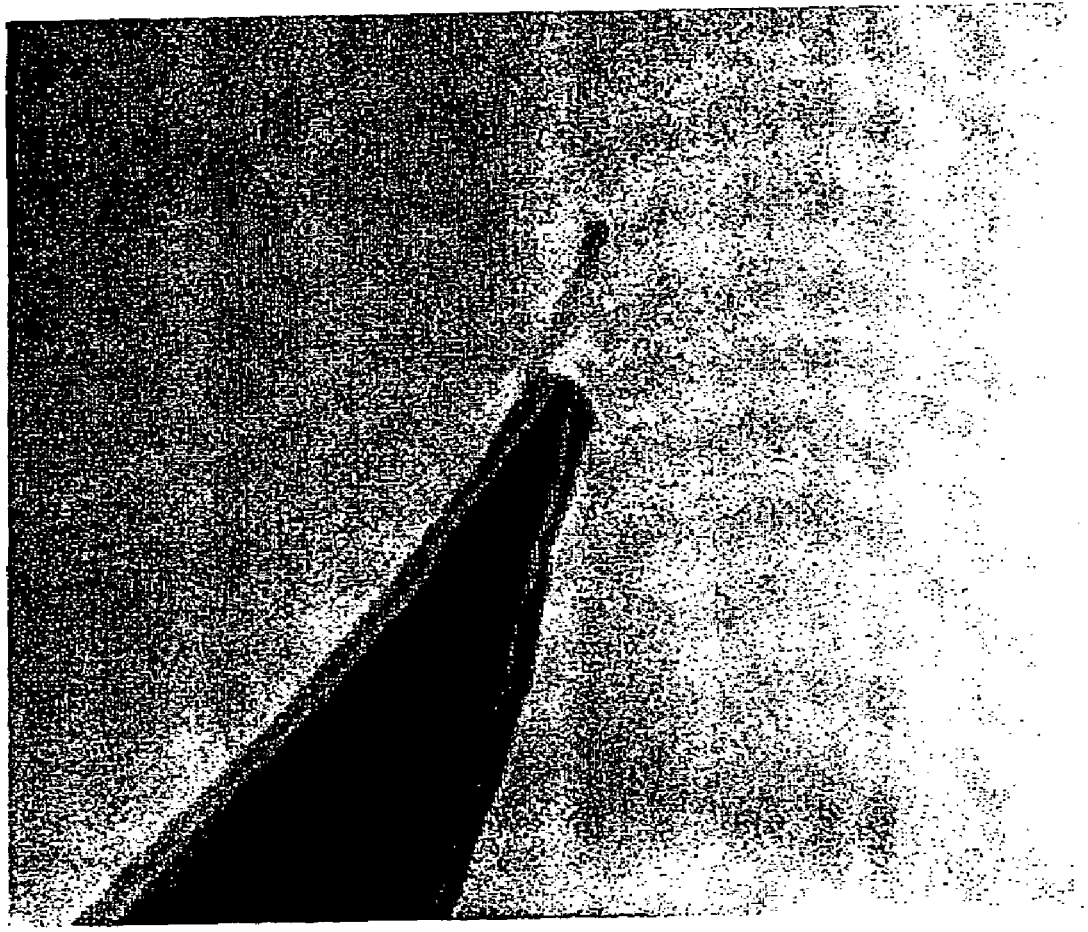
FIGS. 7 through 12 are simplified diagram illustrating experimental results according to embodiments of the present invention

We compared several methods for attaching nanotubes to silicon AFM tips: manual assembly, direct growth, and pickup. Smalley's group reported in Dai, H.; Hafner, J. H.; Rinzler, A. G.; Colbert, D. T.; Smalley, R. E. Nature 1996, 384, 147, the first example of the use of carbon nanotubes as AFM tips in 1996. Manual assembly of AFM probes was found to be relatively simple, although the nanotubes had to be large enough to be seen and manipulated under an optical microscope, and thus did not yield high-resolution probes. While direct growth offers the potential for parallel fabrication of SWNT AFM probes, we found that the yield was quite low. We also determined that the rate-limiting step in probe fabrication was the nanotube shortening step rather than attachment. Therefore, we focused our efforts on the pick-up technique for nanotube attachment, as shown in FIG. 7.

The pick-up technique, developed by Lieber et al., and reported in Hafner, J. H.; Cheung, C. L.; Lieber, C. M. J. Am. Chem. Soc. 1999, 121, 9750, is an efficient and consistent method for mounting SWNTs in the proper orientation. When SWNTs are grown on a flat substrate, a small percentage of the tubes are oriented vertically, and can be picked up when the AFM tip scans across the surface in tapping mode. The nanotube binds to the side of the pyramidal AFM tip via attractive van der Waals forces, and usually remains attached firmly enough that it can be repeatedly pressed into and scanned across the substrate surface. We found that it was important to reduce the field of view (e.g., from 10 μm to 10 nm) or retract the tip as soon as a nanotube was successfully picked up in order to minimize the probability of picking up additional nanotubes. Multiple attached tubes or bundles can lead to AFM image artifacts.

It is also important to note that the ambient humidity appears to affect the efficiency of the pickup method. We found it nearly impossible to pick up nanotubes from a substrate under high humidity conditions. Enclosing the AFM in a glovebag under a flow of dry nitrogen for about 30 min rejuvenated the process. We speculate that an increase in the relative humidity makes it more difficult to pick up nanotubes for two main reasons. First, at higher humidity values, it is harder to overcome capillary forces due to the build up of a surface layer of water on the growth substrate. More force is necessary to pry a prone nanotube off the surface due to increased adhesion. Second, increasing water build up on the tip decreases the attractive interactions of the nanotube to the silicon surface of the AFM tip during pick up. It is known that the van der Waals interactions at the nanotube-AFM tip interface are not strong enough to keep the tube attached to the tip in liquid water. Nanoscopic condensation of water between the AFM tip and the growth substrate at high relative humidity may have an analogous effect on the success rate for picking up a nanotube.

SWNTs were grown via chemical vapor deposition (CVD) on 4 mm to 8 mm square, 500 μm thick p-doped Si wafers. Four different methods were used to coat the substrates with iron catalyst for growing nanotubes suitable for pickup: spin coating a solution of $Fe(NO_3)_3 \cdot 9H_2O$ in isopropyl alcohol, thermal evaporation of iron onto the substrate, electron beam evaporation of iron onto the substrate, and incubation with ferritin. We achieved the most uniform deposition of small (1–2 nm) catalytic sites with high spatial density by using ferritin-derived iron nanoparticles, prepared as described by Dai and co-workers in Li, Y.; Kim, J. W.; Zhang, Y.; Rolandi, M.; Wang, D.; Dai, H. J. Phys. Chem. B 2001, 105, 11424.

Figure 8:
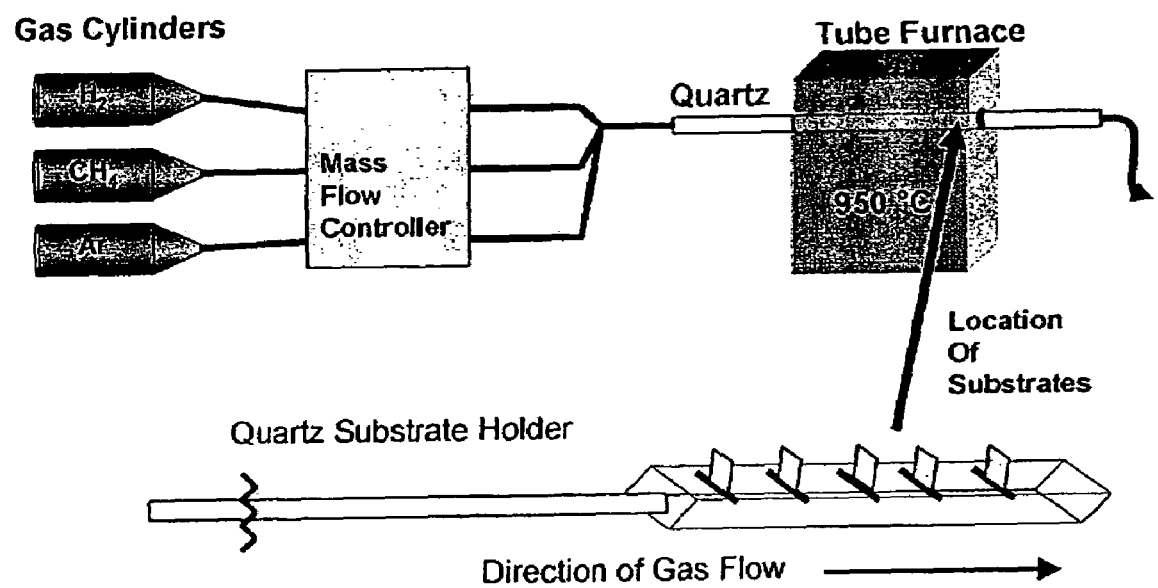

CVD growth was performed in a 22 mm inner diameter Lindberg/Blue M quartz tube furnace with a single heating zone 312 mm long, as shown in FIG. 8. Five wafers are positioned 12.5 mm apart in a specially designed quartz holder, oriented vertically and with the catalyst-coated side facing away from the direction of the incoming gas. A significant advantage of this holder is that it enables up to three small substrates to be mounted side-by-side in each slot for parallel comparison of growth results under nearly identical temperature and gas flow conditions.

We found that growth was faster (5 μm long nanotubes within one minute) and the distribution of tube lengths increased when the catalyst-coated surface was facing away from the incoming gas flow. We speculate that this is due to increased turbulence of the gas flow at the catalyst coated side after passing over the edges of the substrate. Induced turbulence should minimize the role of diffusion-limited growth relative to nucleation rate in the growth kinetics, but at the expense of uniform growth. These growth procedures generate SWNTs on the substrate with diameters ranging from 1.6 to 3.0 nm, and lengths between 100 nm and 5 μm, as imaged with AFM and SEM.

The distribution of tube diameters varied with the size of the catalytic sites. For example, we found that spin coating many drops of dilute solution of the iron nitrate catalyst to give a high density of small catalytic sites gave a slightly broader tube diameter distribution than did ferritin. In contrast, depositing a few drops of higher density iron solutions yielded broad size distributions and larger average tube diameters. Based on AFM analyses of these substrates, it appears that the larger tube diameters resulted from larger catalytic sites on the substrate. No MWNTs have been observed on these substrates.

The long-term stability of pickup substrates appears to vary depending on how they were prepared. Ferritin and ferric nitrate substrates appear to be substantially less effective for pickup attachment after 4 to 6 months. We hypothesize that this is due to the relatively weak mechanical attachment of the catalytic site to the substrate. Over time, vertically oriented tubes that are attached to loosely bound catalytic sites apparently physisorb onto the substrate. Enclosing the AFM in a glovebag with a flow of dry nitrogen for about 30 min substantially enhanced pickup with these older substrates. In contrast, substrates that had the catalytic sites deposited by molecular beam epitaxy (MBE) have demonstrated reliable pickup of nanotubes with an AFM tip over several years without special care.

The diameters of the picked up tubes measured with TEM were typically between 4 and 6 nm. In comparison, the diameters of nanotubes lying horizontally on the substrate, determined by AFM height measurements, were only 2–3 nm. We have ruled out TEM and AFM calibration errors as the cause of this discrepancy. We have also ruled out compression of the imaged nanotubes by the AFM tip, which would result in a decreased apparent diameter. Deformation of the horizontal nanotubes due to van der Waals forces has also been modeled using realistic molecular dynamics simulations based on quantum mechanical calculations, and found insufficient to explain this discrepancy. It appears that this disparity is real and not just an artifact due to tube distortion or measurement error.

This indicates a strong preference for larger diameter tubes to be picked up by silicon AFM probes. There are two plausible explanations for this disparity. One possibility is that larger diameter nanotubes have a higher probability of remaining vertically oriented on the growth substrate over time than smaller diameter tubes. Only the population of smaller diameter nanotubes adsorbed to the growth substrate can be imaged by AFM. Hence, AFM images will be biased toward this part of the distribution of nanotube diameters.

Alternatively, this disparity may be explained by the binding energy of the nanotube to the AFM cantilever tip relative to the binding energy of the nanotube to the substrate. Once a SWNT has been picked up by a scanning AFM tip, there are two kinds of motions that impose stress on the system. The AFM cantilever has a net motion parallel to the substrate. During pick-up, typical horizontal velocities are on the order of 30 000 nm/s. This motion imposes three kinds of stress on the system: shear, bending, and tension. In addition, the cantilever has a rapid vertical oscillation, typically 70–250 kHz, with an amplitude of 40–50 nm, that imposes additional bending and tension stresses.

The mechanical stresses imposed by the cantilever motion on a nanotube attached on one end to the AFM tip, and on the other end to the surface of the growth substrate, will result in one of two outcomes: the nanotube either slips off the cantilever tip and remains attached to the substrate, or the nanotube separates from the substrate interface and is "picked up". The discriminator between these two outcomes is the binding energy at the attachment site of the nanotube to the silicon tip relative to that of its attachment to the substrate. These binding energies will depend on many factors that are virtually impossible to characterize fully, such as the relative lengths of the nanotube adsorbed onto the tip versus the substrate, as well as details of the chemical, physical, and mechanical interactions between the nanotube and these surfaces during scanning in tapping mode. It is known, however, that binding energy scales with the tube diameter, which can be determined directly from both AFM and TEM images.

The strength of nanotube attachment can be approximated as being linearly proportional to the nanotube diameter using the thin-walled cylinder approximation. At the attachment site with the AFM cantilever tip, the nanotube can be considered fixed until the binding energy is exceeded at this interface by the imposed stresses. This binding force increases linearly with diameter, but at a rate 1.6 times faster for tubes greater than 2.7 nm diameter than it does for smaller diameter nanotubes. The increased binding energy for nanotubes greater than 2.7 nm could result in larger diameter nanotubes being preferentially picked up. The relative adhesion strength of the catalytic particle to the tube versus the substrate could also have a significant influence on the diameters of the tubes that are picked up.

As seen in FIG. 7, more than 100 nm of a nanotube typically protrudes from the end of the AFM tip after pickup. High-resolution imaging is not possible with such a long nanotube tip due to thermal fluctuations and bending. Pickup SWNT tips were shortened by a combination of push shortening, an approach developed by Hafner and Lieber as reported in an unpublished communication, March 2002, and electrical pulse etching An HP 8114A pulse generator was used in combination with a Digital Instruments signal access module for all of our pulse shortening experiments.

Push shortening is done by incrementally decreasing the tip-sample separation distance during successive force calibrations to push the nanotube up along the side of an AFM tip. This process requires a picked-up tube of very specific length. Tubes longer than 100 nm tend to buckle inelastically during this process, after which they cannot be shortened by further pushing. Push shortening is superior to pulse etching when further shortening nanotubes less than 100 nm long in very small increments.

We obtain similar results for electrical pulse etching with native oxide coated p-doped silicon, 300 nm thick thermally grown oxide-coated p-doped silicon, and gold-plated silicon substrates. This finding indicates that the entire probe fabrication procedure can be carried out on a single unpatterned, doped-silicon substrate. Thermally grown oxide substrates typically required higher voltages to successfully pulse-shorten than did either native oxide or gold-coated silicon substrates.

Using electrical pulse shortening and push shortening in combination on the same tip relaxes the constraints for obtaining high-quality probes from the nanotube growth substrate and increases yield. Long tubes can be coarsely shortened with electrical pulses until their lengths are less than 100 nm. Push shortening can then be used for finer control in adjusting the probe length.

We frequently found that electrostatic forces would strip nanotubes off the AFM tips when they had been stored in a nonconductive container. An aluminum box with a narrow strip of double-sided tape or a conductive Gel-Pak container both seemed to solve this problem. Prior to use of conductive boxes for nanotube tip storage, we were unsuccessful in TEM imaging the attached nanotube probes.

To characterize the effective resolution of our SWNT probes, we imaged nanotubes resting flat on the silicon growth substrate, using a scanning field of view of 100–350 nm. We define resolution as the full width of the imaged tube measured at the noise floor, minus the measured tube height. While nanotubes are convenient samples for determining resolution, they are not infinitely rigid. Dekker's group has shown in Postma, H. W. C.; Sellmeijer, A.; Dekker, C. *Adv. Mater.* 2000, 12, 1299, that the apparent height of a nanotube measured by tapping mode imaging can decrease substantially at high oscillation amplitudes, even with conventional silicon tips. We have observed similar effects with nanotube probes. For this study, the oscillation amplitude was maintained close enough to its freely oscillating value in air to limit this effect to be within 10% of the true nanotube height.

Figure 9:
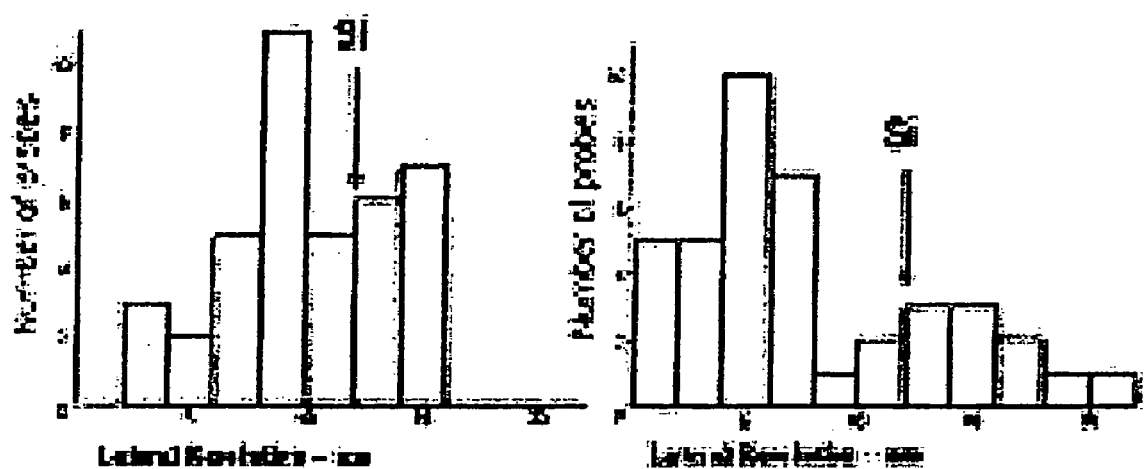

FIG. 9 shows histograms of the lateral resolutions obtained with SWNT probes fabricated using a growth substrate coated with ferric nitrate catalyst versus those fabricated using ferritin as the catalyst. The variation in nanotube probe performance was greater than we expected based on previous reports. Leiber et al. had examined the image quality of different nanotube types (MWNTs and SWNTs) in Cheung, C. L.; Hafner J. H.; Lieber, C.; M. *Proc. Natl. Acad. Sci. U.S.A.* 2000, 97, 3809. In contrast, we compared 39 SWNTs made from the same iron nitrate-coated substrate and 40 from a ferritin substrate. The wide range in resolution found, between the two different kinds of substrate (ferritin vs iron nitrate), as well as from the same substrate, was surprising and underscores the importance of specific nanotube characteristics in determining the maximum achievable resolution.

There is a clear shift in the distribution toward higher resolution probes when ferritin was used as the catalyst, consistent with a narrower catalyst size distribution. It is not clear how much technique improvements rather than the switch to ferritin from ferric nitrate coated substrates played in the comparative distribution. Most of the latter tips were fabricated using ferritin substrates. By that time, we were more careful to reduce the field of view immediately after pick-up to minimize bundle formation. This could explain why there are fewer 10–15 nm resolution tips. However, it is clear that significantly more probes with resolution better than 5 nm were fabricated using ferritin substrates.

Nearly 100 probes were imaged by TEM to characterize the efficacy of different fabrication techniques. Of these, fourteen SWNT probes imaged by TEM had previously been used for tapping-mode topographic imaging. Table 1 presents a summary of probe characteristics determined by TEMAFM correlations for the fourteen SWNT probes. Entries in bold correspond to probes that demonstrated lateral resolution less than the actual nanotube probe diameter.

Image quality is a function of many factors including: tube diameter and length, contact angle, number of nanotubes extending past the silicon tip, thermal noise, and contamination. These factors can lead to substantial variability in resolution. By correlating probe structure and orientation seen in the TEM images with topographic imaging performance, we can provide experimental evidence consistent with previous mechanical modeling carried out by Snow et al., who have shown that lateral tip-sample forces can bend single-wall nanotubes or cause snap-to-contact behavior when the tubes exceed either a critical length or a critical angle relative to the substrate surface normal. These effects introduce a significant degree of broadening and the appearance of image artifacts.

Figure 10:
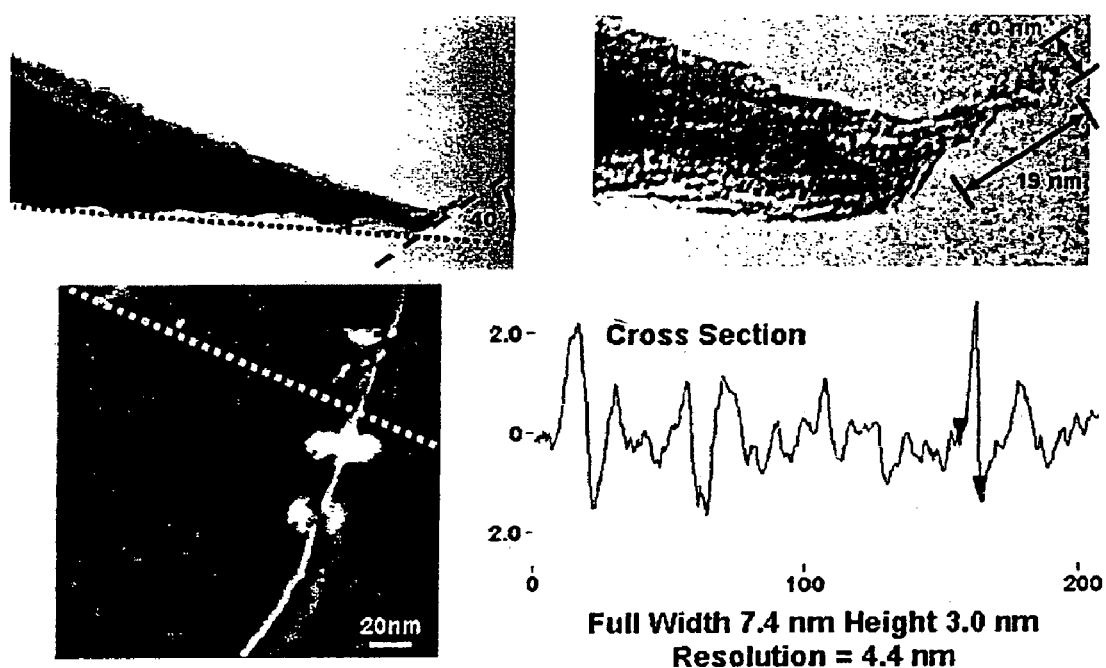

If the nanotube is presented to the sample surface at an angle deviating from the surface normal by more than ~30°, poor resolution and obvious image artifacts result due to tip-sample forces having a significant component perpendicular to the nanotube axis. For example, FIG. 10 shows a 19 nm long, 4 nm diameter nanotube projecting from the probe tip at an angle of 40°. This probe produced an image that contained a positive height "shadowing" artifact approximately 10 nm in width parallel to each sample nanotube. This artifact resulted from the nonideal orientation of the probe. Additionally, the TEM image showed that the nanotube is buckled near the silicon tip. Previous reports have described reversible elastic buckling of the nanotube, which did not have a serious impact on image quality. Our TEM correlations indicate, however, that buckling can, under some circumstances, be inelastic, resulting in irreversible structural changes. This structural defect results in an effectively lower stiffness for the probe, which we believe is responsible for the decreased resolution and imaging artifacts we observe (shadowing features). Similar artifacts were seen with SWNT ropes (multiple SWNTs bundled together) for the same reason; the layered structure of a bundle of nanotubes attached to the AFM tip results in stiffness variation along the probe length.

Figure 11:
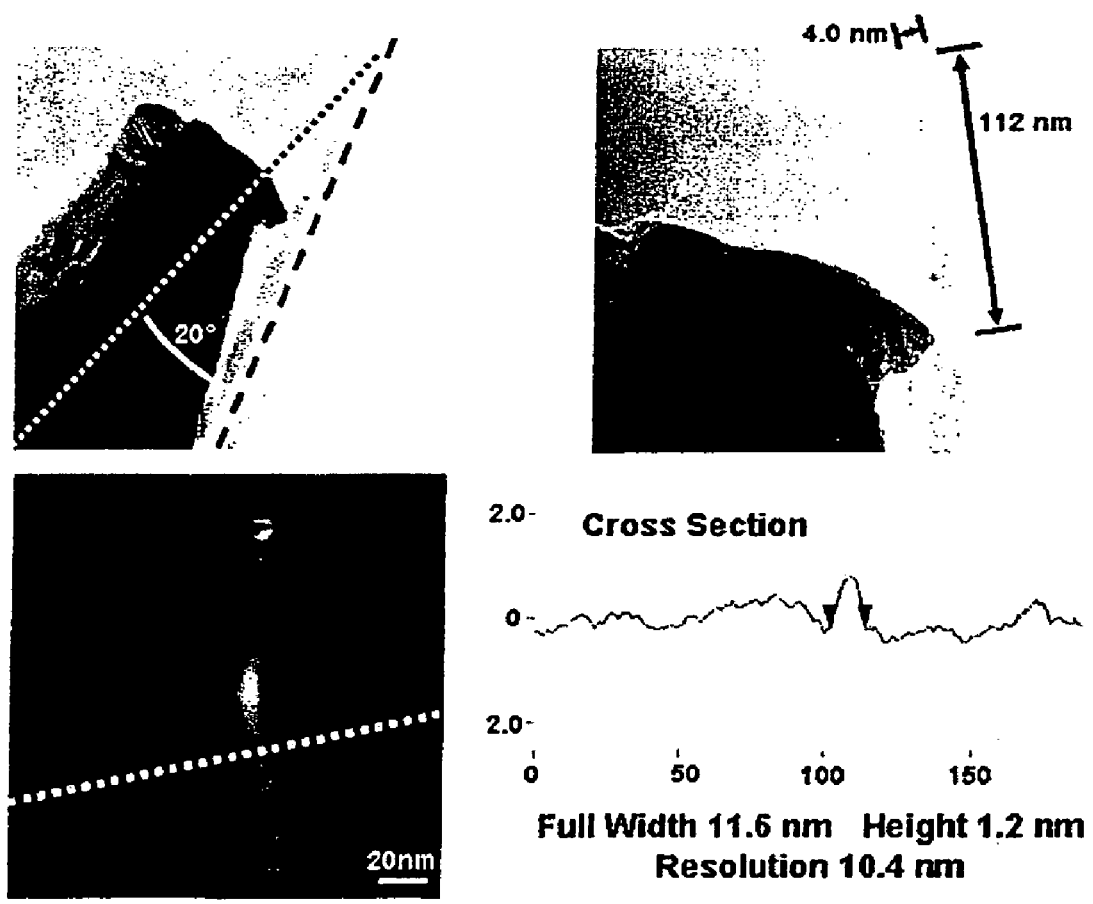

In a preferred embodiment, the SWNT probes have aspect ratios less than ~10 to be adequate for imaging purposes. FIG. 11 shows a 4 nm diameter nanotube protruding 112 nm from the end of the AFM tip, but at an angle deviating from the surface normal by less than 20°. The resulting lateral resolution was still 2.5 times the probe tube diameter. This broadening of the image is due in small part to thermal vibrations. However, mechanical modeling studies have indicated that for a nanotube of this geometry, the root-mean-squared thermal vibrations of the end of the tube should be less than 2 Å. Nanotube bending due to lateral tip-sample forces is most likely the principal contribution to the degraded resolution.

Images taken with high quality nanotube probes show no sign of artifacts. These probes all had the nanotubes oriented on the tip at angles close to the substrate surface normal (within 10–20°) and had protrusion lengths ≦40 nm. By directly measuring the nanotube width from each TEM image and comparing that to the obtained AFM resolution, we have determined the average ratio of AFM resolution to tube diameter for SWNT probes in this class to be 1.17. This is a reasonable value, given that thermal vibrations and bending of the nanotube will always slightly increase its effective imaging diameter.

Figure 12:
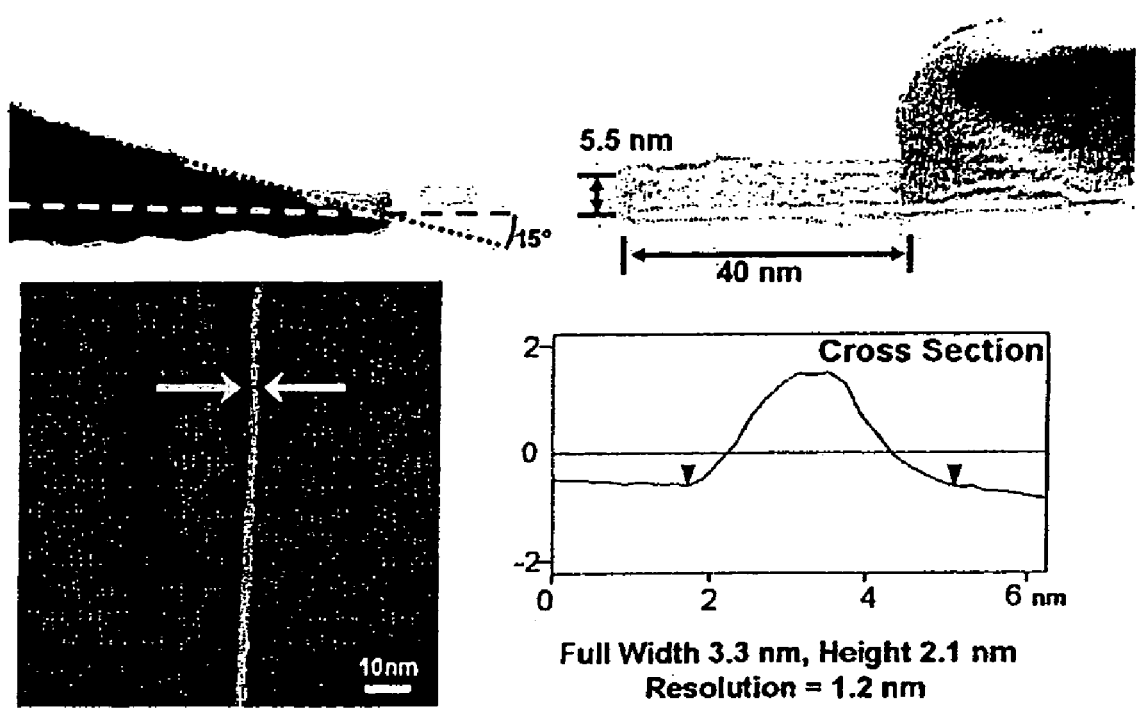

In about ⅓ of the high quality nanotube probes made from the ferritin substrate, as shown in FIG. 12, it was found that the effective lateral resolution was significantly better than the nanotube probe diameter measured directly with TEM. FIG. 12 shows a nanotube probe 5.5 nm in diameter that demonstrated a lateral resolution of 1.2 nm, just 22% of the diameter of the nanotube. It is likely that this enhanced resolution occurs when the nanotube contacts the substrate being imaged with either an asperity or at a specific angle such that only an edge of the nanotube is in contact with the substrate. Imaging a small object with an asperity or an open edge of the tube could lead to the high resolutions observed. Molecular dynamics simulations of surface-nanotube and nanotube-nanotube interactions indicate that other phenomena may also be important, including elastic deformation of the sample nanotube relative to the probe nanotube.

In conclusion, we have combined elements from several previously reported techniques for producing nanotube tips suitable for AFM imaging dry samples that significantly reduce the time of manufacture while improving reproducibility and performance. Feedback from SEM and TEM images of the nanotube probes was used to directly evaluate the effectiveness of the different techniques employed for each of the steps in the fabrication procedure. The optimal process involves the following six steps. (1) Grow nanotubes from ferritin-derived iron nanoparticles on conductive silicon substrates coated only with its native oxide. (2) Pick up a SWNT by imaging the substrate with a 10 μm field of view in tapping mode. (3) Quickly reduce the field of view to approximately 10 nm so that additional tubes are not picked up. (4) Shorten the tube to an appropriate length for imaging without changing substrates using a combination of electrical pulse and push shortening techniques. (5) Image a 100–500 nm region of the substrate to characterize the probe quality. (6) Store shortened nanotube probe in a conductive box.

By growing nanotubes directly on a conductive p-doped silicon substrate with either a native oxide layer or a thermally grown oxide surface layer, it is possible to pick up, shorten, and test the probe resolution without having to switch samples. This proved to be a significant timesaving optimization. We have found that the resulting nanotube growths (diameter and length) are very similar for all of the investigated catalyst deposition techniques if the spatial density and diameters of catalytic sites are similar. Rates of production have typically reached one probe per hour for several consecutive hours. On exceptional days, the rate can be as high as several per hour. This success has been duplicated with incoming group members.

Overall, we have found AFM image quality to be consistently and significantly better with nanotube tips than with the best silicon AFM tips. Correlations of TEM images of SWNT probes with the effective lateral resolution obtained when using these probes for topographical imaging with AFM indicate that approximately one-third of the probes demonstrate resolution better than the diameter of the nanotube probe itself when imaging nanotubes on a smooth substrate. The methodology described here has resulted in a sufficiently high level of productivity to enable development of single-molecule probes and sensors using functionalized nanotube tips, and has proven capable of fabricating AFM probes with the highest resolution reported to date.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating carbon based nanotubes for scanning probe microscopy, the method comprising:
   providing an AFM tip structure, the AFM tip structure including a first end, a second end, and a length defined between the first end and the second end, the second end being a free end;
   attaching a carbon based nanotube structure along a portion of the length of the AFM tip structure to extend a total length of the AFM structure to include the length of the AFM tip structure and a first length associated with the carbon based nanotube structure;
   applying an electrical bias between the AFM tip structure and a substrate to cause a reducing of the carbon based nanotube structure from the first length to a second length, and
   forcing the carbon based nanotube structure in a direction parallel to the second length to reduce the second length to a third length of the carbon based nanotube structure using a pushing action along the direction parallel to the second length to cause the carbon based nanotube structure to move along a portion of the length of the AFM tip structure.

2. The method of claim 1 wherein the electrical bias ranges from about 3 volts to about 50 volts.

3. The method of claim 1 wherein the substrate can be selected from a conductive doped-silicon or oxidized doped-silicon or gold plated or otherwise made somewhat electrically conductive material.

4. The method of claim 1 wherein the electrical bias comprises one or more pulsed voltages.

5. The method of claim 1 wherein the electrical bias comprises one or more pulsed voltages of less than 100 micro-seconds.

6. The method of claim 1 wherein the first length is greater than 2 micrometers.

7. The method of claim 1 wherein the second length ranges from about 10 nanometers to about 200 nanometers.

8. The method of claim 1 wherein the attaching comprises using attractive forces between a portion of the AFM tip structure and a portion of the carbon based nanotube structure.

9. The method of claim 1 wherein the attaching comprises moving the AFM tip structure along a portion of substrate comprising a plurality of carbon based nanotube structures to attract one of the carbon based nanotube structures onto the portion of the AFM tip structure.

10. The method of claim 1 wherein the electrical bias ablates a portion of the carbon based nanotube structure.

11. The method of claim 1 wherein the pushing action is provided using mechanical force on an end of the carbon based nanotube structure in the direction parallel to the second length.

12. The method of claim 1 wherein the electrical bias is applied to the AFM tip structure.

13. The method of claim 1 wherein the third length is less than about 100 microns.

14. The method of claim 1 wherein the attaching comprises substantially Vanderwaals forces between a portion of the AFM tip structure and a portion of the carbon based nanotube structure.

15. A method for fabricating carbon based nanotubes for scanning probe microscopy including atomic force microscope ("AFM") applications, the method comprising:
providing an AFM tip structure, the AFM tip structure including a first end, a second end, and a length defined between the first end and the second end, the second end being a free end;
providing the AFM tip structure along a first portion of a substrate comprising a plurality of carbon based nanotube structures thereon;
attaching at least one of the carbon based nanotube structure from the plurality of carbon based nanotube structures from the substrate along a portion of the length of the AFM tip structure to extend a total length of the AFM structure to include the length of the AFM tip structure and a first length associated with the carbon based nanotube structure;
providing the AFM tip structure including the carbon based nanotube structure along a second portion of the substrate;
applying an electrical bias between the AFM tip structure and an electrically grounded substrate to cause a reducing of the carbon based nanotube structure from the first length to a second length;
providing the AFM tip structure including the carbon based nanotube structure of the second length to a third portion of the substrate, and
forcing the carbon based nanotube structure in a direction parallel to the second length using the third portion of the substrate to reduce the second length to a third length of the carbon based nanotube structure using a pushing action along the direction parallel to the second length to cause the carbon based nanotube structure to move along a portion of the length of the AFM tip structure.

16. The method of claim 15 wherein the substrate is a single substrate being maintained in a stationary position.

17. The method of claim 15 wherein the first portion, the second portion, and the third portion of the substrate are different spatial locations.

18. The method of claim 15 wherein the forcing causes the carbon based nanotube structure to slide along the portion of the length of the AFM tip structure.

19. The method of claim 15 wherein the attaching is provided using Vanderwaals forces between a portion of the AFM tip structure and a portion of the carbon based nanotube structure.

20. A method for fabricating assembled structures, the method comprising:
providing a tip structure, the tip structure including a first end, a second end, and a length defined between the first end and the second end, the second end being a free end;
attaching a nano-sized structure along a portion of the length of the tip structure to extend a total length of the tip structure to include the length of the tip structure and a first length associated with the nano-sized structure;
shortening the nano-sized structure from the first length to a second length, and
pushing the nano-sized structure in a direction parallel to the second length to reduce the second length to a third length of the nano-sized structure along the direction parallel to the second length to cause the nano-sized structure to move along a portion of the length of the tip structure.

21. The method of claim 19 wherein the pushing causes a portion of the nano-sized structure to slide along the portion of the length of the tip structure.

22. A method for manufacturing carbon based nanotubes, the method comprising:
providing a tip structure, the tip structure including a first end, a second end, and a length defined between the first end and the second end, the second end being a free end;
moving the tip structure along a first region comprising a plurality of carbon based nanotube structures thereon;
attaching at least one of the carbon based nanotube structure from the plurality of carbon based nanotube structures from the first region along a portion of the length of the tip structure to extend a total length of the tip structure to include the length of the tip structure and a first length associated with the carbon based nanotube structure;
moving the tip structure including the carbon based nanotube structure along a second region;
applying an electrical bias between the tip structure at the end of the first length associated with the carbon based nanotube structure and an electrically grounded substrate to cause a reducing of the carbon based nanotube structure from the first length to a second length;
moving the tip structure including the carbon based nanotube structure of the second length to a third region of the substrate;
forcing the carbon based nanotube structure in a direction parallel to the second length using the third region to reduce the second length to a third length of the carbon based nanotube structure using a pushing action along the direction parallel to the second length to cause the carbon based nanotube structure to move along a portion of the length of the tip structure;
removing the tip structure including the attached carbon based nanotube structure;
repeating the above elements of providing a tip structure; moving the tip structure along a first region comprising a plurality of carbon based nanotube structures thereon; attaching at least one of the carbon based nanotube structure; moving the tip structure including the carbon based nanotube structure along a second region; applying an electrical bias between the tip structure at the end of the first length associated with the carbon based nanotube structure and the electrically grounded substrate to cause a reducing of the carbon based nanotube structure from the first length to a second length; moving the tip structure including the carbon based nanotube structure of the second length to a third region of the substrate; forcing the carbon based nanotube structure in a direction parallel to the second length using the third region to reduce the second length; and removing the tip structure including the attached carbon based nanotube structure for N repetitions, whereupon N is an integer greater than 1, and
repeating the above elements at a rate of M repetitions whereupon M equal to N divided by hours, whereupon M is an integer greater than three.

23. The method of claim 22 wherein M is an integer greater than five.

24. The method of claim 22 wherein M is an integer greater than ten.

25. The method of claim 22 wherein the tip structure comprises an AFM tip structure.

26. The method of claim 22 wherein the first region, the second region, and the third region are provided on a single substrate, the single substrate being maintained on a stage.

27. The method of claim 26 wherein the stage is moved relative to the tip structure.

28. The method of claim 26 wherein the tip structure is moved relative to the stage.

29. A method for assembling carbon based nanotubes, the method comprising:
   providing a tip structure, the tip structure including a first end, a second end, and a length defined between the first end and the second end, the second end being a free end;
   moving the tip structure along a first region comprising a plurality of carbon based nanotube structures thereon;
   attaching at least one of the carbon based nanotube structure from the plurality of carbon based nanotube structures from the first region along a portion of the length of the tip structure to extend a total length of the tip structure to include the length of the tip structure and a first length associated with the carbon based nanotube structure;
   moving the tip structure including the carbon based nanotube structure along a second region;
   applying an electrical bias between the tip structure at the end of the first length associated with the carbon based nanotube structure and the second region to cause a reducing of the carbon based nanotube structure from the first length to a second length;
   removing the tip structure including the attached carbon based nanotube structure;
   repeating the above elements of providing a tip structure; moving the tip structure along a first region comprising a plurality of carbon based nanotube structures thereon; attaching at least one of the carbon based nanotube structure; moving the tip structure including the carbon based nanotube structure along a second region; applying an electrical bias between the tip structure at the end of the first length associated with the carbon based nanotube structure and the second region to cause a reducing of the carbon based nanotube structure from the first length to a second length.

30. The method of claim 29 wherein the substrate is electrically grounded.

31. A system for manufacturing nanotubes, the system comprising:
   a member;
   a tip structure coupled to the member, the tip structure including a first end, a second end, and a length defined between the first end and the second end, the second end being a free end;
   a first region comprising a plurality of nanotube structures, the first region being within a vicinity of the tip structure, at least one of the nanotube structures from the plurality of nanotube structures from the first region being attached along a portion of the length of the tip structure to extend a total length of the tip structure to include the length of the tip structure and a first length associated with the nanotube structure;
   a second region within a vicinity of the tip structure including the nanotube structure;
   a power source coupled to the tip structure, the power source being adapted to apply an electrical bias between the tip structure at the end of the first length associated with the nanotube structure and the second region to cause a reducing of the nanotube structure from the first length to a second length;
   a third region within a vicinity of the tip structure including the nanotube structure of the second length;
   whereupon the nanotube structure is forced in a direction parallel to the second length using the third region to reduce the second length to a third length of the nanotube structure using a pushing action along the direction parallel to the second length to cause the nanotube structure to move along a portion of the length of the tip structure.

* * * * *

UNITED STATES PATENT AND TRADEMARK OFFICE
CERTIFICATE OF CORRECTION

| | |
|---|---|
| PATENT NO. | : 7,211,795 B2 |
| APPLICATION NO. | : 11/045240 |
| DATED | : May 1, 2007 |
| INVENTOR(S) | : Charles Patrick Collier et al. |

Page 1 of 1

It is certified that error appears in the above-identified patent and that said Letters Patent is hereby corrected as shown below:

In column 1, line 15, delete "N/A" and insert the following:

-- The invention described herein was made in the performance of work under a NASA contract, and is subject to the provisions of Public Law 96-517 (35 U.S.C. 202) in which the Contractor has elected to retain title. --

Signed and Sealed this

Thirtieth Day of December, 2008

JON W. DUDAS
*Director of the United States Patent and Trademark Office*